United States Patent
Park et al.

(10) Patent No.: US 7,572,711 B2
(45) Date of Patent: Aug. 11, 2009

(54) METHOD OF MANUFACTURING A SEMICONDUCTOR DEVICE

(75) Inventors: Jong-Chul Park, Gyeonggi-do (KR);
Sang-Sup Jeong, Gyeonggi-do (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 384 days.

(21) Appl. No.: 11/173,189

(22) Filed: Jun. 30, 2005

(65) Prior Publication Data
US 2006/0063324 A1    Mar. 23, 2006

(30) Foreign Application Priority Data
Jun. 30, 2004    (KR) ........................ 10-2004-0050191

(51) Int. Cl.
*H01L 21/48* (2006.01)
(52) U.S. Cl. ............... 438/396; 438/381; 257/E29.111; 257/E21.536
(58) Field of Classification Search .......... 257/E21.016, 257/E21.111, E21.539; 438/396–399, 381
See application file for complete search history.

(56) References Cited

U.S. PATENT DOCUMENTS

| | | | |
|---|---|---|---|
| 6,331,471 B1 | 12/2001 | Lee et al. | |
| 6,461,911 B2 * | 10/2002 | Ahn et al. | 438/253 |
| 6,815,752 B2 * | 11/2004 | Kitamura | 257/306 |
| 2001/0026974 A1 * | 10/2001 | Reinberg | 438/239 |
| 2002/0079526 A1 * | 6/2002 | Fukuda et al. | 257/298 |
| 2002/0106856 A1 * | 8/2002 | Lee et al. | 438/255 |
| 2002/0163026 A1 * | 11/2002 | Park | 257/301 |
| 2003/0132429 A1 * | 7/2003 | Kim et al. | 257/1 |
| 2003/0232483 A1 * | 12/2003 | Fujiishi | 438/396 |
| 2004/0053463 A1 * | 3/2004 | Matsumura | 438/241 |

(Continued)

FOREIGN PATENT DOCUMENTS

KR    2004-0022648    3/2002

(Continued)

OTHER PUBLICATIONS

English language abstract of Korean Publication No. 10-0348297.

(Continued)

*Primary Examiner*—Douglas M Menz
*Assistant Examiner*—Matthew W Such
(74) *Attorney, Agent, or Firm*—Marger Johnson & McCollom, P.C.

(57) ABSTRACT

In an embodiment, a simplified method of manufacturing a semiconductor device reduces a step between cell and peripheral areas. First and second openings are formed through a plurality of thin layers including a support layer on a substrate. A storage electrode and a guide ring are formed on sidewalls and bottoms of the first and second openings, respectively. A support pattern is formed so that the support layer in the cell area is partially etched and the support layer in the peripheral area remains un-etched, thus the support pattern supports and surrounds the storage electrodes adjacent to each other in the cell area and prevents an etching of a layer underlying the support layer in the peripheral area. A dielectric layer and a plate electrode are formed on the storage electrode to complete a semiconductor device with the reduced step.

7 Claims, 32 Drawing Sheets

U.S. PATENT DOCUMENTS

2005/0051822 A1* 3/2005 Manning .................... 257/296
2005/0054159 A1* 3/2005 Manning et al. ............ 438/253

FOREIGN PATENT DOCUMENTS

| KR | 10-0348297 | 7/2002 |
|---|---|---|
| KR | 2002-0073942 | 9/2002 |

OTHER PUBLICATIONS

English language abstract of Korean Publication No. 2002-0073942.
English language abstract of Korean Publication No. 2004-0022648.

* cited by examiner

CELL AREA | PERIPHERAL AREA

METHOD OF MANUFACTURING A SEMICONDUCTOR DEVICE

CROSS REFERENCE TO RELATED APPLICATION

This application claims priority under 35 USC § 119 to Korean Patent Application No. 2004-50191, filed on Jun. 30, 2004, the contents of which are incorporated herein by reference in its entirety.

BACKGROUND OF THE INVENTION

1. Field of the Invention

The present invention relates to a method of manufacturing a semiconductor device. More particularly, the present invention relates to a method of manufacturing a semiconductor device that includes a cylindrical capacitor.

2. Description of the Related Art

Higher cell capacitance is often used to improve characteristics of a memory cell in a dynamic random access memory (DRAM) device. The increased cell capacitance improves read-out capacity of the memory cell and reduces soft errors. Meanwhile, as semiconductor memory devices have become more highly integrated, the unit memory cell of the semiconductor memory device has continuously decreased in area. As a result, a capacitor in the unit memory cell has also needed to continuously decrease in area.

Capacitors having a high capacitance that are formed in typically restricted areas have been studied. These studies are mainly directed to a three-dimensional structure of a storage node electrode in a capacitor for increasing an effective area of the capacitor. Currently, various storage node electrodes having a three-dimensional structure such as a trench structure, a stacked structure, a cylindrical structure, and a combination thereof, as well as other structures have been developed.

Attempting to increase the capacitance by improving the structure of the storage node electrode, however, is restricted due to a limit of a design rule, increases of error ratios caused by complicated processes, etc. As a result, most attempts are regarded skeptically with respect to the possibility of producing a capacitor having the above-mentioned structures. Therefore, a method of manufacturing a capacitor that is capable of overcoming the above-mentioned problems is in demand. In particular, to improve a capacitance of the cylindrical capacitor requires forming a storage node electrode having a greatly increased height.

However, the storage node electrode collapses due to its increased height, creating an electrical bridge between adjacent storage node electrodes.

To prevent these bridges, a method for forming a storage electrode of a cylindrical capacitor is disclosed in Korean Patent Laid Open Publication No. 2002-0073942. According to the above disclosure, an insulating interlayer on a semiconductor substrate is patterned using a photoresist pattern to form a linear pattern. A fixing layer that includes an insulation material, for example silicon nitride, is formed on the linear pattern to prevent a collapse or lean of a capacitor.

FIGS. 1 to 4 are cross-sectional views illustrating a conventional method of forming a storage electrode of a cylindrical capacitor that has a lean-preventing structure.

Referring to FIG. 1, a cylindrical storage electrode 40 is formed on a semiconductor substrate 10, which includes a lower structure having a contact plug 12 and a contact pad 22 to electrically contact the cylindrical storage electrode 40 with the contact plug 12. The semiconductor substrate 10 is divided into a cell array region and a peripheral region.

The cylindrical storage electrode 40 is formed in the cell array region to contact an upper face of the contact pad 22. A dielectric layer 60 and a plate electrode 70 are sequentially formed on the cylindrical storage electrode 40. Here, a reference numeral 30 refers to an etching stop layer pattern, and a reference numeral 50 refers to a supporting layer pattern, which is connected between the adjacent storage electrodes 40, for preventing a collapse of the storage electrodes 40.

Referring to FIG. 2, a sacrificial layer 80 is formed on the plate electrode 70. Here, the sacrificial layer 80 is positioned in the cell array region and the peripheral region. Thus, a portion of the sacrificial layer 80 in the cell array region has a height higher than that of a portion of the sacrificial layer 80 in the peripheral region.

Referring to FIG. 3, a mask layer pattern (not shown) that covers the peripheral region and exposes the cell array region is formed on the sacrificial layer 80. The sacrificial layer 80 is partially etched by a dry etching process using the mask layer pattern as an etching mask. The mask layer pattern is then removed.

Referring to FIG. 4, the etched sacrificial layer 80 is planarized to expose the plate electrode 70 in the cell array region.

To readily perform the dry etching process and the planarization process by the above-mentioned conventional method unfortunately requires the sacrificial layer 80 to have a large thickness of more than about 20,000 Å.

Also, the planarization process is expensive. As a result, the photolithography process, the dry etching process, and the planarization process of the conventional methods for forming the capacitor are complicated and costly.

SUMMARY OF THE INVENTION

Embodiments of the present invention provide a method of manufacturing a semiconductor device that solves the problems cited above by reducing a step between the cell area and the peripheral area.

In a method of manufacturing a semiconductor device in accordance with one aspect of the present invention, a first opening and a second opening are formed through a plurality of thin layers including a support layer on a substrate. The first opening through which a top surface of a contact pad is exposed is formed in a cell area of the substrate, and the second opening is formed in a boundary region of the cell area and a peripheral area of the substrate. A storage electrode is formed on a sidewall and a bottom of the first opening, and a guide ring is formed on a sidewall and a bottom of the second opening by removing a conductive layer formed along the sidewalls and bottoms of the first and second openings. A support pattern is formed by etching the thin layers so that the support layer in the cell area is partially etched and the support layer in the peripheral area remains un-etched to thereby be exposed, so that the support pattern supports and surrounds a plurality of storage electrodes adjacent to each other in the cell area and prevents a layer underlying the support layer from being etched in the peripheral area. A dielectric layer and a plate electrode are sequentially formed on the storage electrode to thereby complete a semiconductor device that is capable of reducing a step between the cell area and the peripheral area.

BRIEF DESCRIPTION OF THE DRAWINGS

The above and other features and advantages of the present invention will become readily apparent by reference to the following detailed description when considered in conjunction with the accompanying drawings wherein:

FIGS. 1 to 4 are cross-sectional views illustrating a conventional method of forming a storage electrode of a cylindrical capacitor that has a lean-preventing structure.

DESCRIPTION OF THE PREFERRED EMBODIMENTS

Embodiments of the present invention now will be described more fully hereinafter with reference to the accompanying drawings, in which embodiments of the invention are shown.

FIGS. 5 to 26 are views illustrating processing steps for forming a capacitor for a semiconductor device according to an exemplary embodiment of the present invention. The same reference numbers will be used to refer to the same or like parts as those shown in the above drawings.

Figure 1:
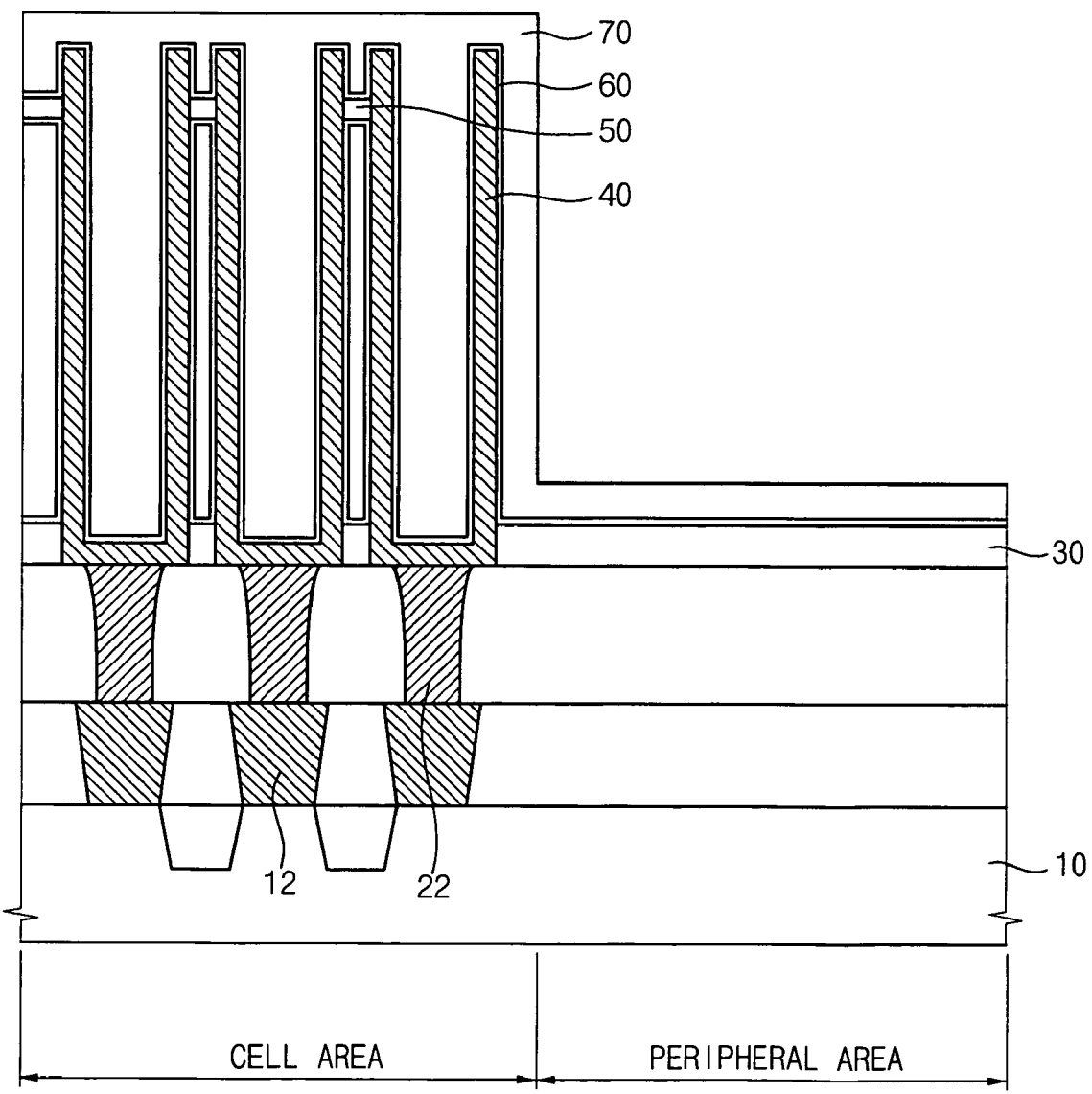
Figure 2:
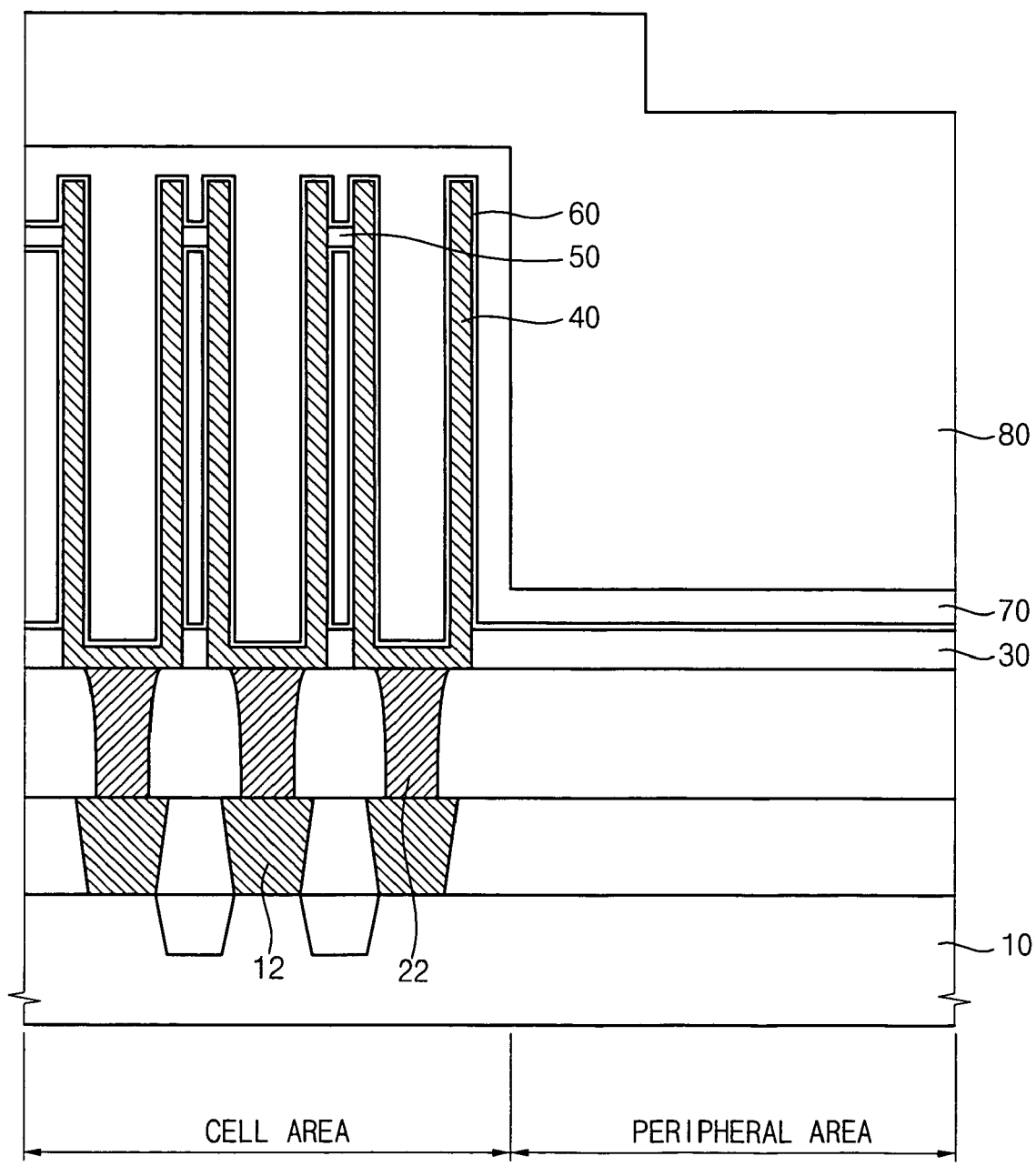
Figure 3:
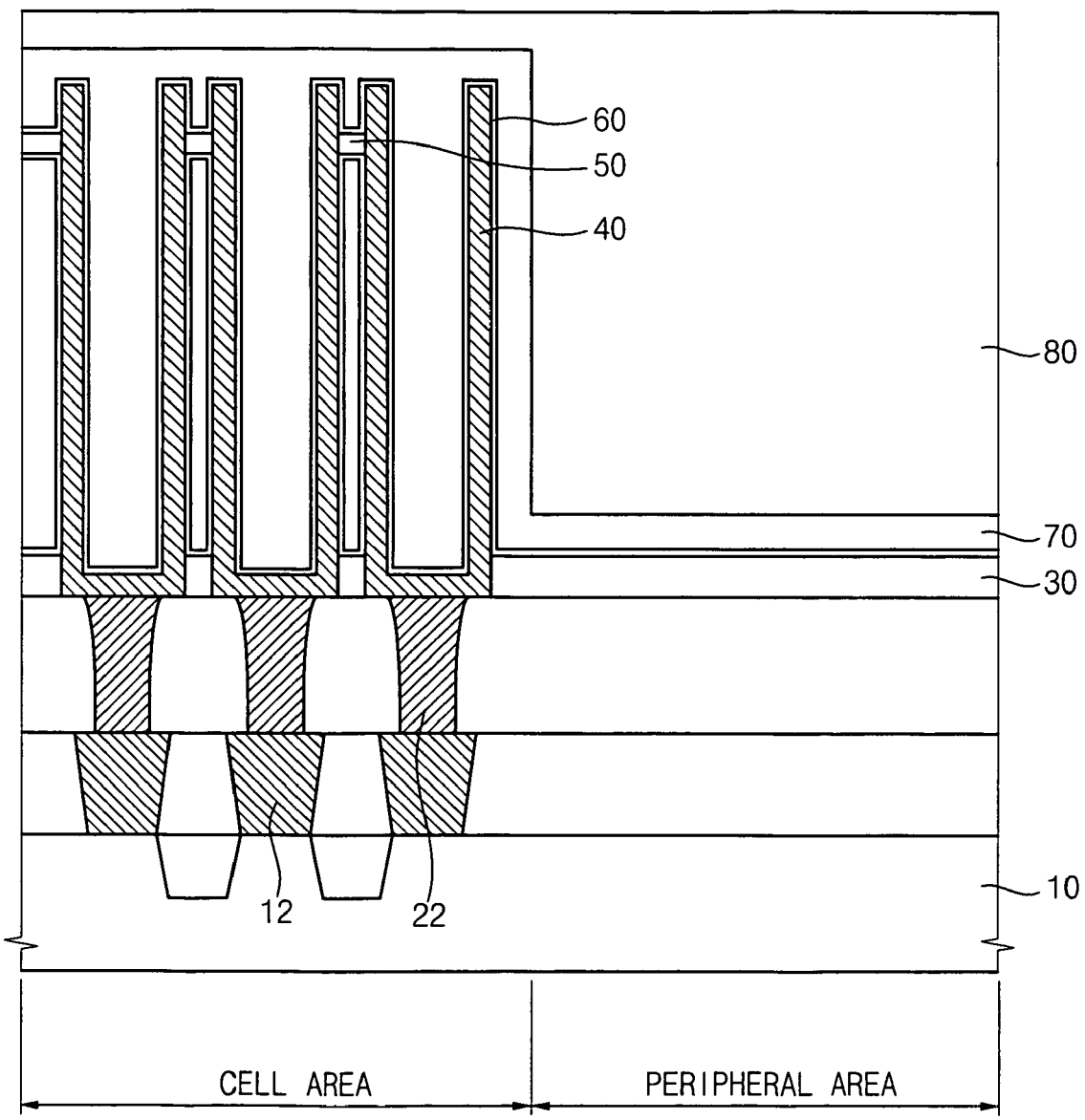
Figure 4:
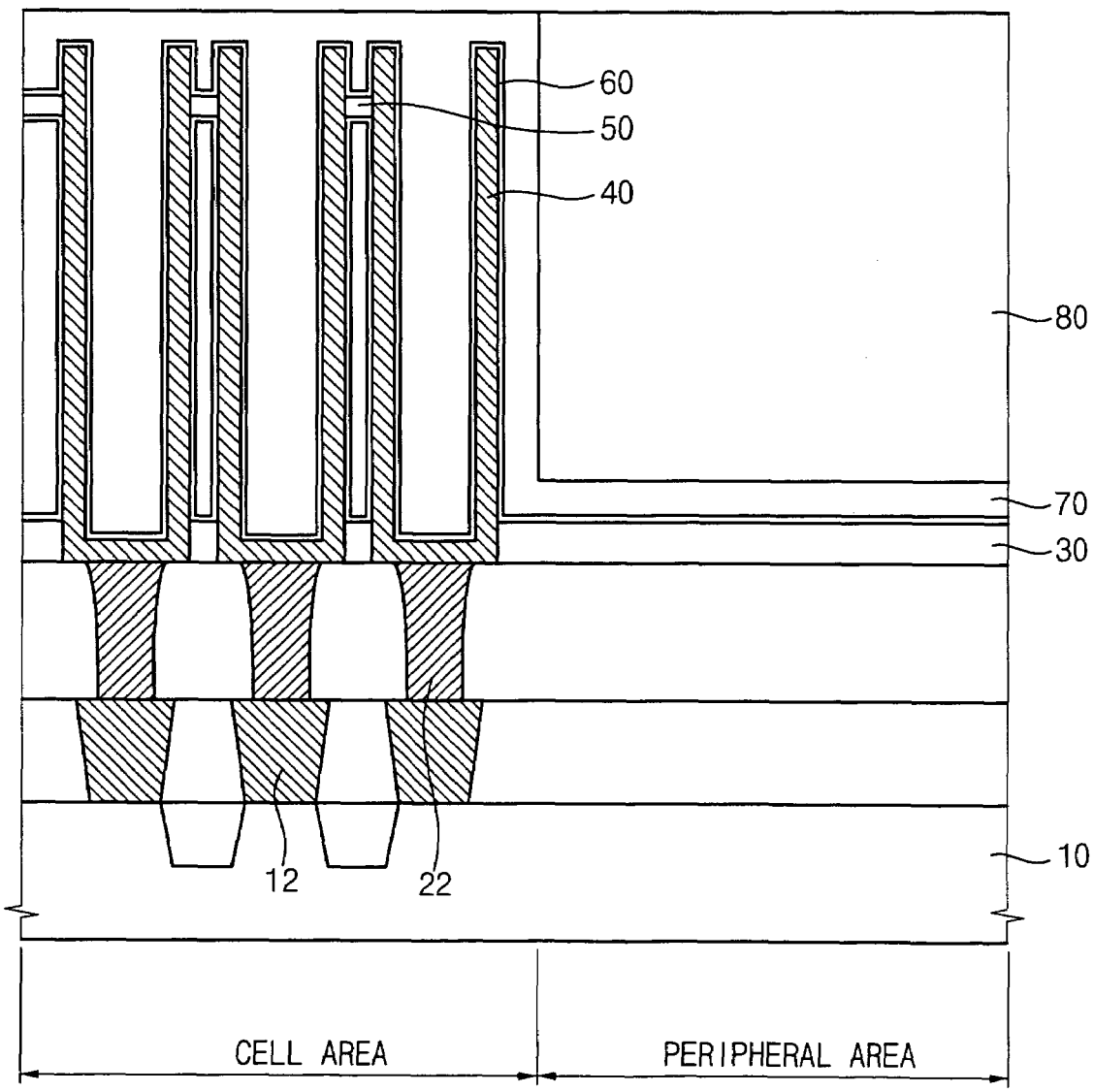
Figure 5:
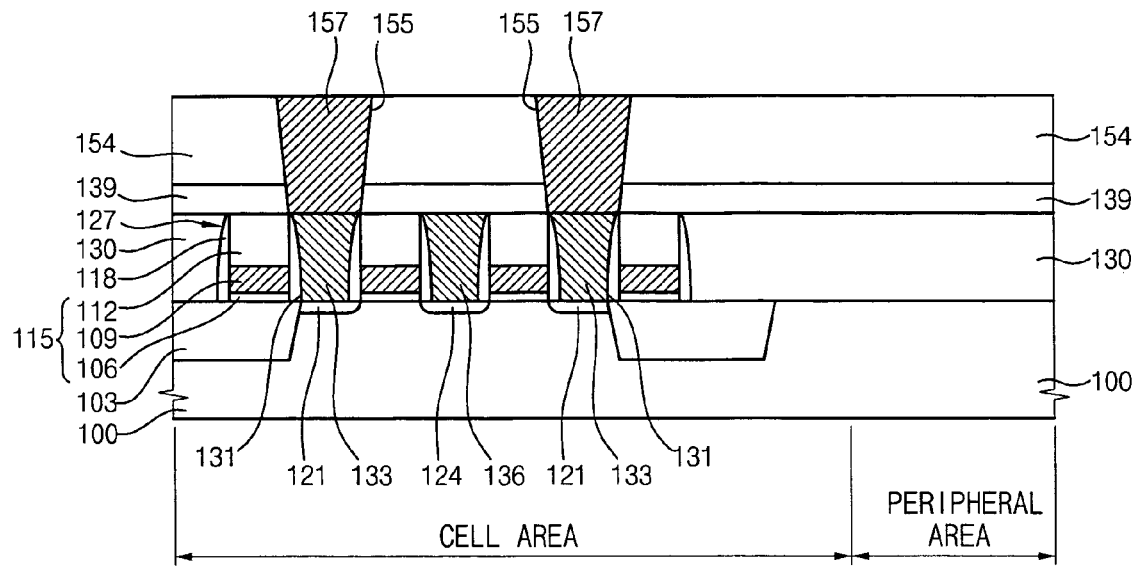
FIGS. 5 and 6 are cross-sectional views illustrating conductive structures on a semiconductor substrate according to an exemplary embodiment of the present invention.
Figure 6:
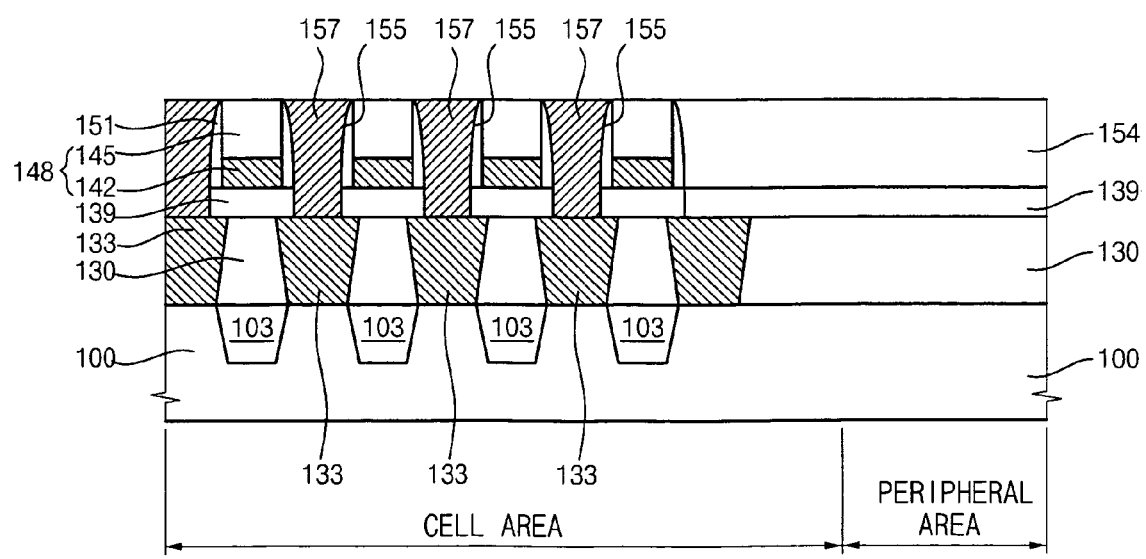

FIGS. 5 and 6 are cross-sectional views illustrating conductive structures on a semiconductor substrate according to an exemplary embodiment of the present invention. FIG. 5 is a cross-sectional view taken along a bit line of the semiconductor device, and FIG. 6 is a cross-sectional view taken along a word line of the semiconductor device.

Referring to FIGS. 5 and 6, a semiconductor substrate 100 such as a silicon wafer is prepared to have a cell region C and a peripheral region P. The semiconductor substrate 100 is separated into an active region and a field region through an isolation process such as a shallow trench isolation (STI) process or a local oxidation of silicon (LOCOS) process. The active region is electrically isolated from surroundings on the substrate 100 by an isolation layer 103 such as a silicon oxide layer in the field region.

Then, a gate oxide layer (not shown), a first conductive layer (not shown) and a first mask layer (not shown) are sequentially stacked on the substrate 100 of the active region. A first photoresist pattern is formed on the first mask layer. The first mask layer, the first conductive layer, and the gate oxide layer are then sequentially etched using the first photoresist pattern as an etching mask, so that a gate structure is formed on the substrate 100 of the active region to include a gate oxide pattern 106, a gate conductive pattern 109, and a gate mask pattern 112.

A first insulation layer (not shown) comprising a nitride such as a silicon nitride is formed on the substrate 100 including the gate structure 115, and then the first insulation layer is anisotropically etched to thereby form a first spacer 118, which is a gate spacer, on a sidewall of the gate structure 115.

An ion implantation process is performed using the gate structure 115 as an ion implantation mask, so that dopants are implanted onto a substrate surface exposed between the gate structures adjacent to each other. Then a heat treatment is performed on the substrate 100 including the dopants, so that a first contact area 121 and a second contact area 124 are formed on the substrate 100. The first and second contact areas 121 and 124 correspond to source/drain regions of a transistor, respectively. As a result, a MOS transistor structure including the first and second contact areas 121 and 124 and the gate structure 115 is formed on the substrate 100, and a series of the MOS transistor structures forms a word line 127 of the semiconductor device.

A first insulation interlayer 130 is formed on a whole surface of the substrate 100, so that the word line 127 is covered with the first insulation interlayer 130. The first insulation interlayer 130 may include an oxide layer such as a boron phosphorous silicate glass (BPSG) layer, a phosphorous silicate glass (PSG) layer, an undoped silicate glass (USG) layer, a spin on glass (SOG) layer, a tetraethylorthosilicate (TEOS) layer, and an oxide layer formed by a high-density plasma CVD process.

The first insulation interlayer 130 is then removed by a chemical mechanical polishing (CMP) process, an etch-back process, or a combination thereof until a top surface of the word line 127 is exposed, so that a top surface of the first insulation interlayer 130 is planarized. Subsequently, a second photoresist pattern (not shown) is formed on the first insulation interlayer 130, and the first insulation interlayer 130 is partially and anisotropically etched using the second photoresist pattern as an etching mask to thereby form a first contact hole 131 through which the first and second contact areas 121 and 124 are exposed.

The second photoresist pattern is removed from the first insulation interlayer 130, and a second conductive layer (not shown) is formed on the first insulation interlayer 130 so that the first contact hole 131 is filled with the second conductive layer. The second conductive layer may comprise a doped polysilicon highly doped with impurities, a metal nitride such as a titanium nitride or a metal such as tungsten and copper.

The second conductive layer is then removed and planarized by a chemical mechanical polishing (CMP) process, an etch-back process, or a combination thereof until a top surface of the first insulation interlayer 130 is exposed, so that the second conductive layer only remains in the first contact hole 131 to thereby form a first pad 133 and a second pad 136. In the present embodiment, the first and second pads 133 and 136 are self-aligned contact pads.

A second insulation interlayer 139 is formed on the first insulation interlayer 130 including the first and second pads 133 and 136. Thus a bit line 148 that is to be formed in a subsequent process is electrically insulated from the first pad 133. The second insulation interlayer 139 may include an oxide layer such as a boron phosphorous silicate glass (BPSG) layer, a phosphorous silicate glass (PSG) layer, an undoped silicate glass (USG) layer, a spin on glass (SOG) layer, a tetraethylorthosilicate (TEOS) layer, and an oxide layer formed by a high-density plasma CVD process. The second insulation interlayer 139 is then removed and planarized by a chemical mechanical polishing (CMP) process, an etch-back process, or a combination thereof.

A third photoresist pattern (not shown) is formed on the second insulation interlayer 139, and the second insulation interlayer 139 is partially and anisotropically etched using the third photoresist pattern as an etching mask to thereby form a second contact hole (not shown) through which the second pad 136 in the first insulation interlayer 130 is exposed. In the present embodiment, the second contact hole is a bit line contact hole for a bit line contact making contact with the bit line 148 and the second pad 136.

The third photoresist pattern is removed from the second insulation interlayer 139, and a third conductive layer (not shown) is formed on the second insulation interlayer 139 so that the second contact hole is filled up with the third conductive layer. A second mask layer (not shown) is formed on the third conductive layer.

A fourth photoresist pattern (not shown) is formed on the second mask layer, and the second mask layer and the third conductive layer are sequentially patterned using the fourth photoresist pattern as an etching mask. Accordingly, a third pad (not shown) is formed in the second contact hole, and the bit line 148 including a bit line conductive pattern 142 and a bit line mask 145 is formed on the second insulation interlayer 139. In the present embodiment, the third pad includes a second bit line contact pad electrically connecting the second pad 136 and the bit line 148.

The bit line conductive pattern 142 may include a first layer comprising a metal and a second layer comprising a metal compound. As an exemplary embodiment, the first layer comprises titanium and titanium nitride (Ti/TiN), and the second layer comprises tungsten (W). The bit line mask 145 protects the bit line conductive pattern 142 in a subsequent etching process for a storage electrode, so that the bit line mask 145 comprises a material having an etching selectivity with respect to a fourth insulation interlayer 160 comprising an oxide and a mold layer 166. For example, the bit line mask 145 comprises a nitride such as a silicon nitride.

A second insulation layer (not shown) is formed on the bit line 148 and the second insulation interlayer 139, and then is anisotropically etched to thereby form a second spacer 151, which is a bit line spacer, on a sidewall of the bit line 148. The second spacer 151 protects the bit line 148 in a formation process of a fourth pad 157 that is a second storage node contact pad, so that the second spacer 151 comprises a material having an etching selectivity with respect to the second insulation interlayer 139 comprising an oxide and with respect to a third insulation interlayer that is to be formed in a subsequent process. In the present embodiment, the second spacer 151 comprises a nitride such as a silicon nitride.

A third insulation interlayer 154 is formed on the second insulation interlayer 139 so that the bit line 148 and the second spacer 151 on the sidewall of the bit line 148 are covered with the third insulation interlayer 154. The third insulation interlayer 154 may include an oxide layer such as a boron phosphorous silicate glass (BPSG) layer, a phosphorous silicate glass (PSG) layer, an undoped silicate glass (USG) layer, a spin on glass (SOG) layer, a tetraethylorthosilicate (TEOS) layer, and an oxide layer formed by a high-density plasma CVD process. As described above, the third insulation interlayer 154 comprises the same material as the second insulation interlayer 139. However, the third insulation interlayer 154 may comprise a material different from the second insulation interlayer 139, as would be known to one of ordinary skill in the art. In the present embodiment, an oxide layer formed by the HDP-CVD process is used as the third insulation interlayer 154 for filling a gap between the bit lines 148 without a void at a low temperature. The third insulation interlayer 154 is then removed and planarized by a chemical mechanical polishing (CMP) process, an etch-back process, or a combination thereof until a top surface of the bit line mask 145 is exposed, so that the top surface of the bit line mask 145 and a top surface of the third insulation interlayer 154 are positioned on the same plane.

A fifth photoresist pattern (not shown) is formed on the third insulation interlayer 154, and the third insulation interlayer 154 and the second insulation interlayer 139 are partially etched to thereby form a third contact hole 155 through which the first pad 133 is exposed. In the present embodiment, the third contact hole 155 functions as a storage node contact hole, and is self-aligned with respect to the first pad 133 by the second spacer 151 on the sidewall of the bit line 148.

A fourth conductive layer (not shown) is formed on the third insulation layer 154 to a sufficient thickness so that the third contact hole 155 is filled with the fourth conductive layer, and then is removed and planarized by a chemical mechanical polishing (CMP) process, an etch-back process, or a combination thereof until a top surface of the bit line 148 and a top surface of the third insulation interlayer 154 are exposed. Accordingly, the fourth conductive layer remains only in the third contact hole 155 to thereby form a fourth pad 157 corresponding to a second storage node contact pad for electrically connecting the first pad 133 and a storage electrode that is to be formed in a subsequent process. The storage electrode is electrically connected to the first contact area 121 through the fourth pad 157 and the first pad 133. In the present embodiment, the fourth pad comprises a polysilicon doped with impurities or a metal. The first insulation interlayer 130, the second insulation interlayer 139 and the third insulation interlayer 154 extends over a cell region and a peripheral region of the substrate 100, and the conductive structure is formed only on the cell region of the substrate 100.

Figure 7:
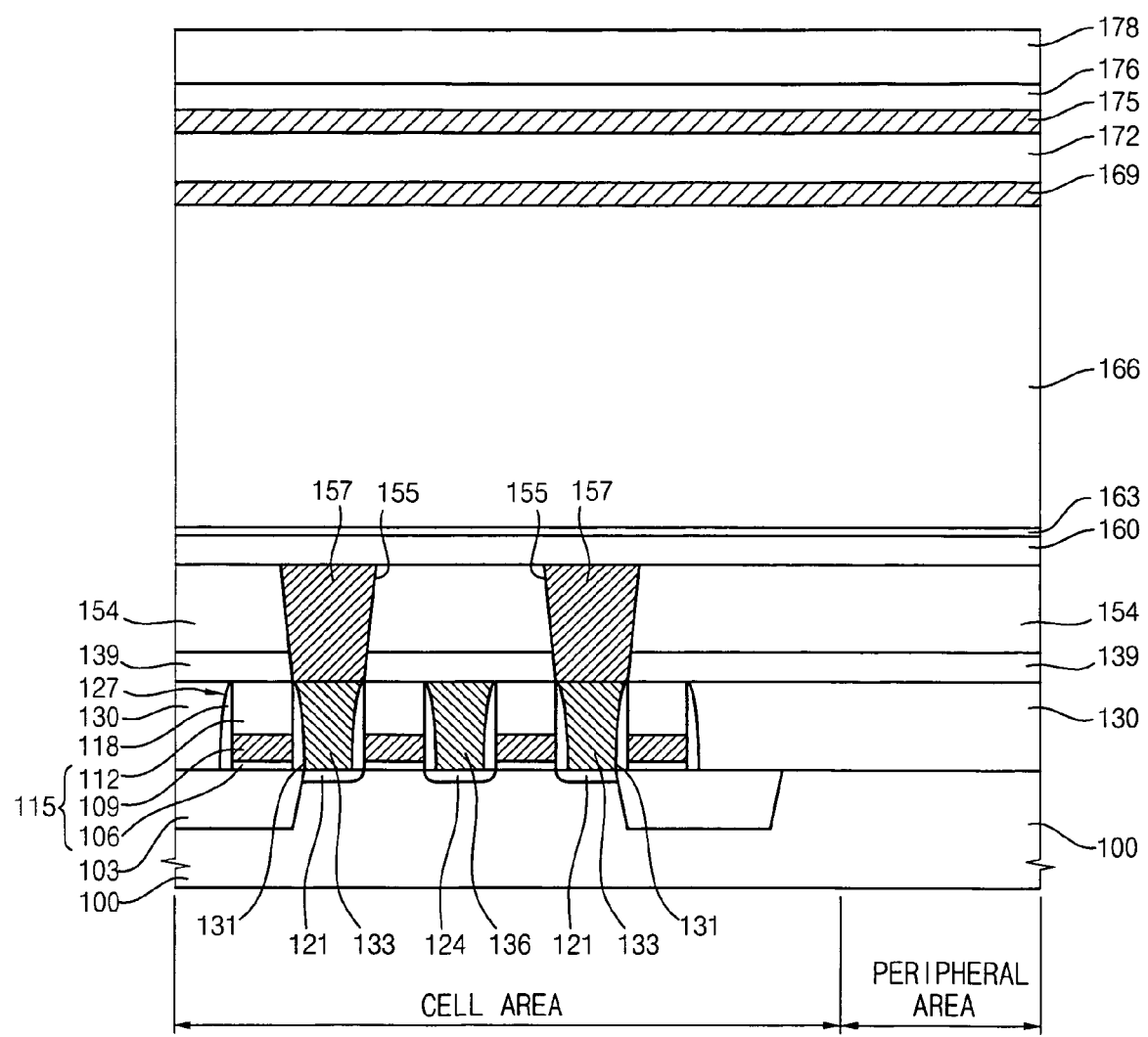
FIGS. 7 and 8 are cross-sectional views illustrating processing steps for forming a mold layer and a polishing stop layer on the conductive structures according to an exemplary embodiment of the present invention.
Figure 8:
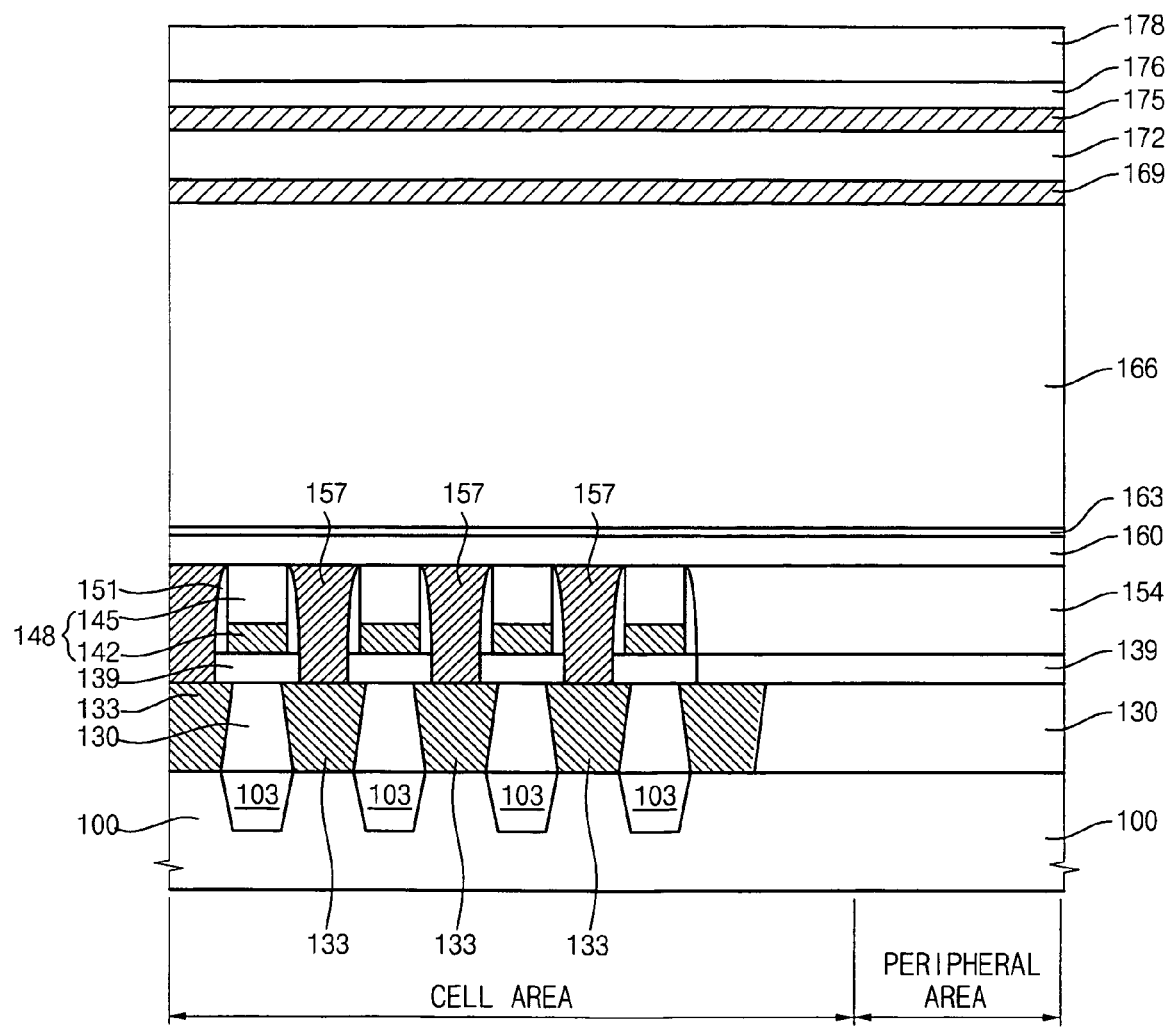

FIGS. 7 and 8 are cross-sectional views illustrating processing steps for forming a mold layer and a polishing stop layer on the conductive structures according to an exemplary embodiment of the present invention.

Referring to FIGS. 7 and 8, a plurality of thin layers is formed on the fourth pad 157, the bit line 148 and the third insulation interlayer 154. In the present embodiment, the thin layers include a fourth insulation interlayer 160, an etching stop layer 163, a mold layer 166, a support layer 169, a first sacrificial layer 172, a polishing stop layer 175, a buffer oxide layer 176, and a third mask layer 178 that are sequentially stacked.

At first, the fourth insulation interlayer 160 is formed on the fourth pad 157, the bit line 148 and the third insulation interlayer 154, and may include an oxide layer such as a boron phosphorous silicate glass (BPSG) layer, a phosphorous silicate glass (PSG) layer, an undoped silicate glass (USG) layer, a spin on glass (SOG) layer, a tetraethylorthosilicate (TEOS) layer, and an oxide layer formed by a high-density plasma CVD process. The fourth insulation interlayer 160 electrically insulates the bit line 148 from the storage electrode 193 that is to be formed in a subsequent process. The fourth insulation interlayer 160 may comprise the same material as the third insulation interlayer 154 and/or the second insulation interlayer 139. However, the fourth insulation interlayer 160 may comprise a material different from the third insulation interlayer 154 and/or the second insulation interlayer 139, as would be known to one of ordinary skill in the art.

The etching stop layer 163 is formed on the fourth insulation interlayer 160, and comprises a material having an etching selectivity with respect to the fourth insulation interlayer 160 and the mold layer 166. In the preset embodiment, the etching stop layer 163 comprises a nitride such as a silicon nitride. A top surface of the fourth insulation interlayer 160 is removed and planarized by a chemical mechanical polishing (CMP) process, an etch-back process, or a combination thereof, and the etching stop layer 163 is formed on the planarized surface of the fourth insulation interlayer 160.

The mold layer 166 for forming the storage electrode 193 is formed on the etching stop layer 163 to a thickness of about 5,000 Å to about 50,000 Å from a top surface of the etching stop layer 163. The mold layer 166 may include an oxide layer such as a boron phosphorous silicate glass (BPSG) layer, a phosphorous silicate glass (PSG) layer, an undoped silicate glass (USG) layer, a spin on glass (SOG) layer, a tetraethylorthosilicate (TEOS) layer, and an oxide layer formed by a high-density plasma CVD process. In the present embodiment, the TEOS layer is used as the mold layer 166. The thickness of the mold layer 166 is varied in accordance with the desired capacitance of a capacitor 211 of the present embodiment. A height of the capacitor 211 is mainly determined by the thickness of the mold layer 166, thus a desired capacitance of the capacitor may be obtained by controlling the thickness of the mold layer 166. In addition, the capacitor 211 of the present embodiment is supported by the support pattern 208 (FIG. 25) to thereby improve a structural stability. As a result, the capacitor 211 of the present embodiment may have a greater height without being broken even though a diameter thereof would not be changed. That is, the capacitor 211 is not easily broken despite its increased aspect ratio, thus the structural stability is remarkably improved due to the support pattern.

The support layer 169 is formed on the mold layer 166 to a thickness of about 400 Å to about 5,000 Å. The thickness of the support layer 169 is exemplarily described, so that the support layer 169 is not to be limited by the above-mentioned thickness range, and many apparent variations of the thickness are possible without departing from the scope of the present invention.

The first sacrificial layer 172 is formed on the support layer 169 to a thickness of about 1,000 Å to about 6,000 Å, and may include an oxide layer such as a boron phosphorous silicate glass (BPSG) layer, a phosphorous silicate glass (PSG) layer, an undoped silicate glass (USG) layer, a spin on glass (SOG) layer, a tetraethylorthosilicate (TEOS) layer, and an oxide layer formed by a high-density plasma CVD process.

The mold layer 166 and the first sacrificial layer 172 have the same etching rate with respect to a predetermined etchant, and have an etching rate greater than the support layer 169 with respect to the predetermined etchant. In the present embodiment, the mold layer 166 has an etching selectivity of no more than about 200:1 with respect to the support layer 169. When the mold layer 166 and the first sacrificial layer 172 comprise the TEOS layer or an oxide layer formed by a HDP-CVD process, and the support layer 169 comprises silicon nitride, the mold layer 166 and the first sacrificial layer 172 are more rapidly etched than the support layer 169 in an etchant including fluoride hydrogen or in an etchant including ammonium hydroxide (NH4OH), hydrogen peroxide (H2O2) and de-ionized water.

The polishing stop layer 175 is formed on the first sacrificial layer 172 for stopping a CMP process for forming the storage electrode in a subsequent process. The storage electrode is formed to have a uniform height by the polishing stop layer 175. The polishing stop layer 175 comprises a material having an etching selectivity with respect to the buffer oxide layer 176 and a storage node mask layer for forming the storage electrode. In the present embodiment, the polishing stop layer 175 comprises a silicon nitride, and is formed to a thickness of about 50 Å to about 1,000 Å at a temperature of about 600° C. to about 1,100° C. and at a pressure of about 1 mTorr to about 50 Torr.

The buffer oxide layer 176 is formed on the polishing stop layer 175 for reducing interactions between the polishing stop layer 175 and the third mask layer 178 for forming a storage node mask.

The third mask layer 178 is formed on the buffer oxide layer 176, and may comprise a material having an etching selectivity with respect to the mold layer 166, the support layer 169, the first sacrificial layer 172, and a polishing stop layer 175. In the present embodiment, the third mask layer 178 comprises a polysilicon, and is formed to a thickness of about 100 Å to about 6,000 Å from a top surface of the buffer oxide layer 176.

Figure 9:
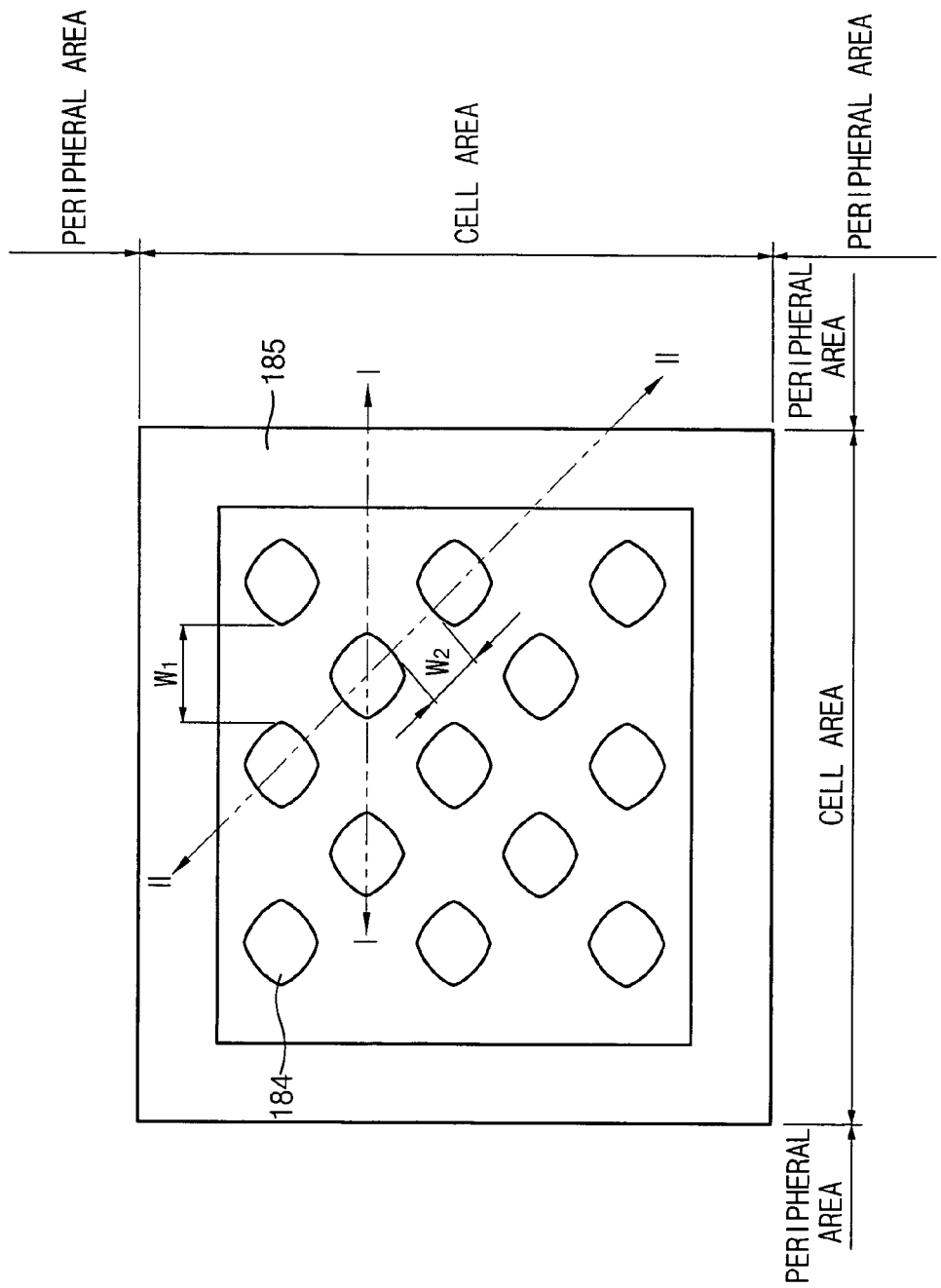
FIG. 9 is a plan view illustrating a processing step for forming the first and second openings through which a surface of the substrate is exposed according to an exemplary embodiment of the present invention.
Figure 10:
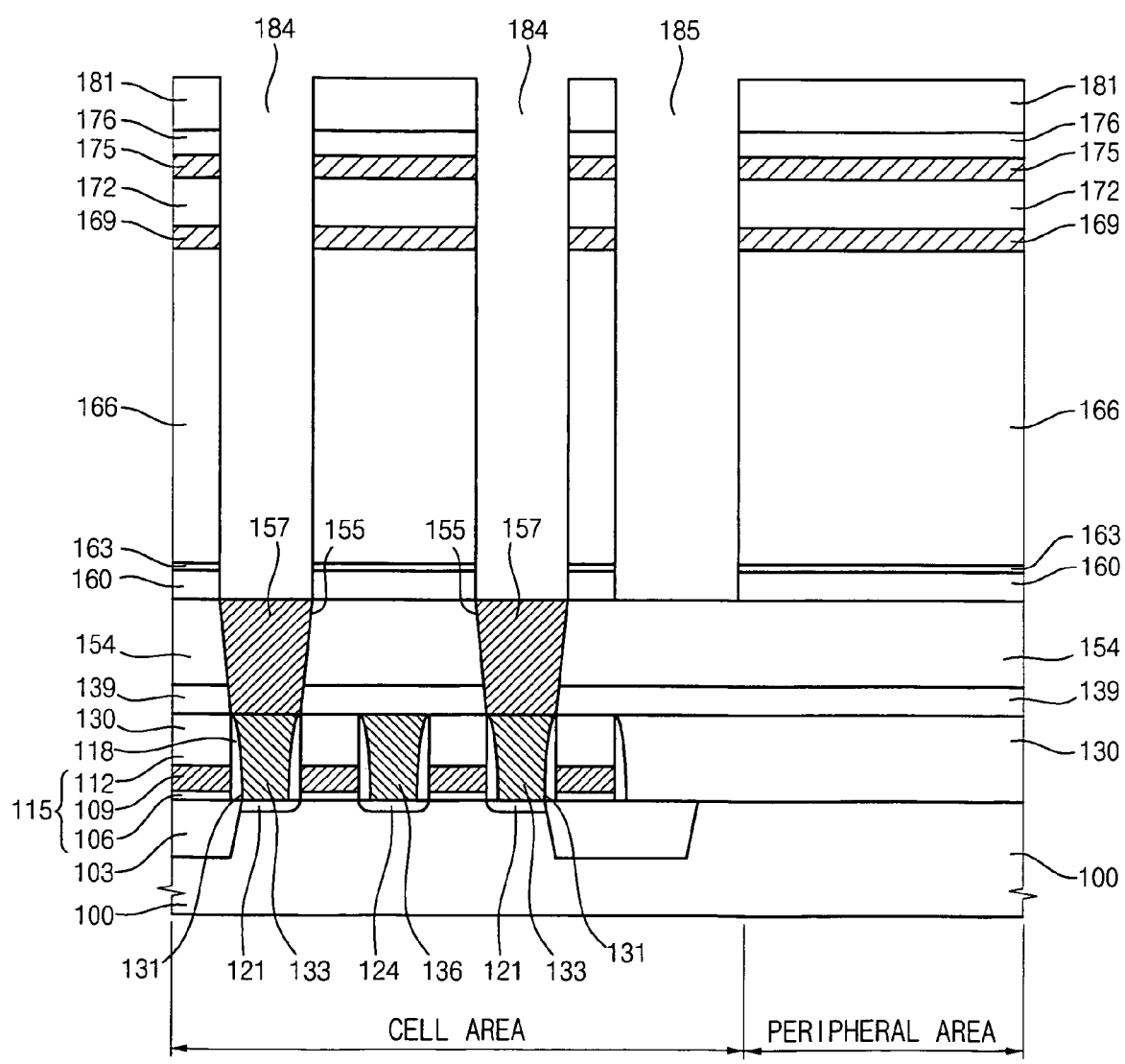
FIG. 10 is a cross-sectional view taken along a line I-I of FIG. 9.
Figure 11:
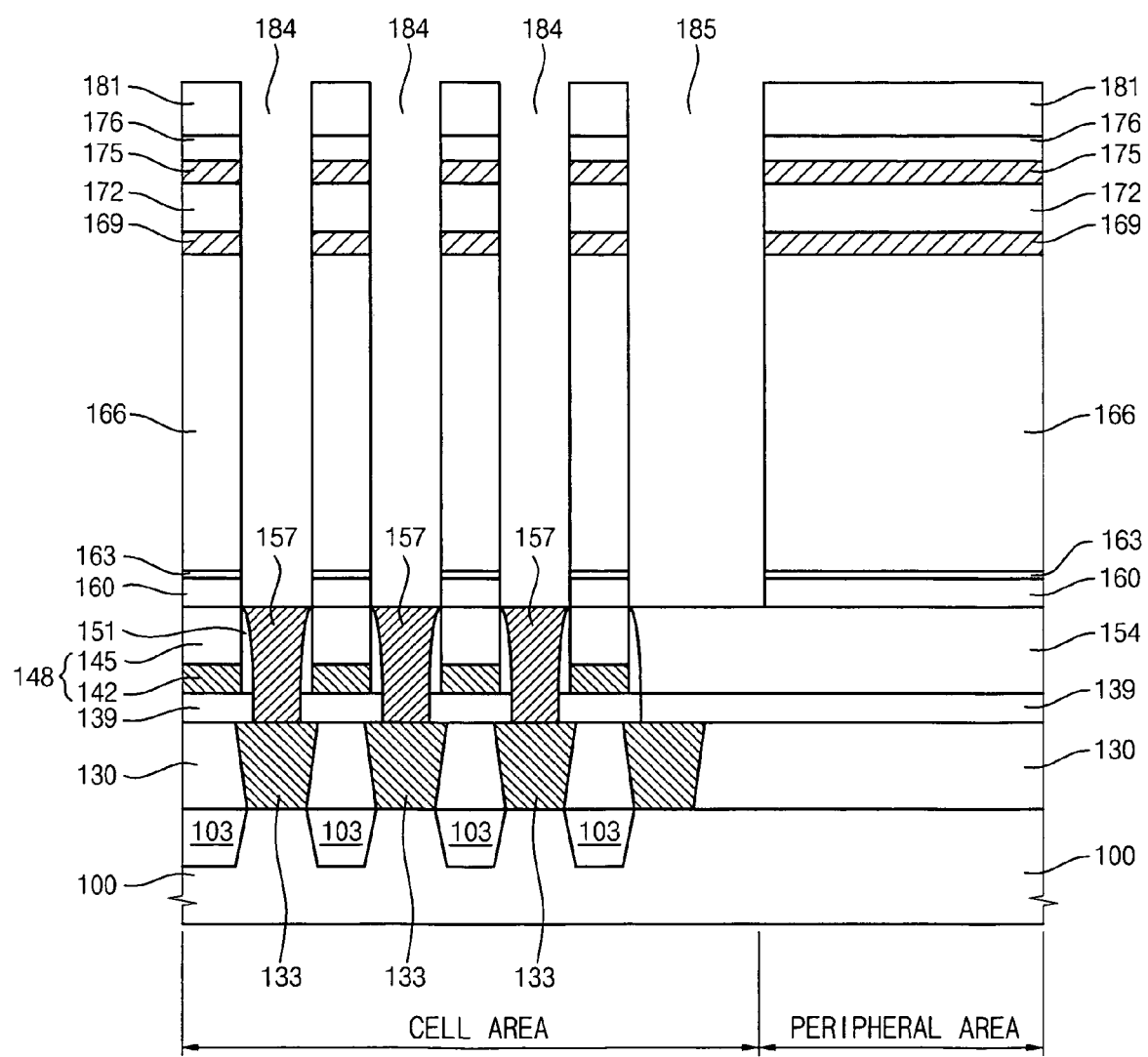
FIG. 11 is a cross-sectional view taken along a line II-II of FIG. 9.

FIG. 9 is a plan view illustrating a processing step for forming the first and second openings through which a surface of the substrate is exposed according to an exemplary embodiment of the present invention. FIG. 10 is a cross-sectional view taken along a line I-I of FIG. 9, and FIG. 11 is a cross-sectional view taken along a line II-II of FIG. 9. Hereinafter, a direction in which an underlying conductive structure such as the word line 127 or the bit line 148 is formed is referred to as a first direction that is parallel with the line I-I, and a direction inclined to the first direction with an angle downward either left-to-right or right-to-left is referred to as a second direction that is parallel with or perpendicular to the line II-II.

Referring to FIGS. 9 to 11, a sixth photoresist pattern is formed on the third mask layer 178, and the third mask layer 178 is patterned using the sixth photoresist pattern as an etching mask to thereby form a storage node mask 181 for forming the storage electrode on the buffer oxide layer 176. A reflection preventive layer (not shown) may be further formed on the third mask layer 178 before the sixth photoresist pattern is formed, though not shown in the figures.

The buffer oxide layer 176, the polishing stop layer 175, the first sacrificial layer 172, the support layer 169, the mold layer 166, the etching stop layer 163, and the fourth insulation interlayer 160 are sequentially and anisotropically etched away using the storage node mask as an etching mask to thereby form a first opening 184 and a second opening 185 through which the fourth pad 157 is exposed. The first opening 184 is formed in the cell region of the substrate 100, and the second opening 185 is formed around the cell region to thereby surround the cell region. Accordingly, the second opening 185 is formed between the cell region and the peripheral region of the substrate 100, and the first opening 184 is formed in the cell region of the substrate 100. A metal contact plug 217 (FIG. 27) electrically connected to the capacitor 211 is formed in the second opening 185, so that the second opening 185 has a sufficient thickness to include the metal contact plug 217. Preferably, the second opening 185 has a uniform width.

In the present embodiment, a plasma etching process or a reactive ion etching process may be performed for forming the first and second openings 184 and 185, and the sixth photoresist pattern is removed from the third mask layer 178 by conventional ashing and strip processes.

Figure 12:
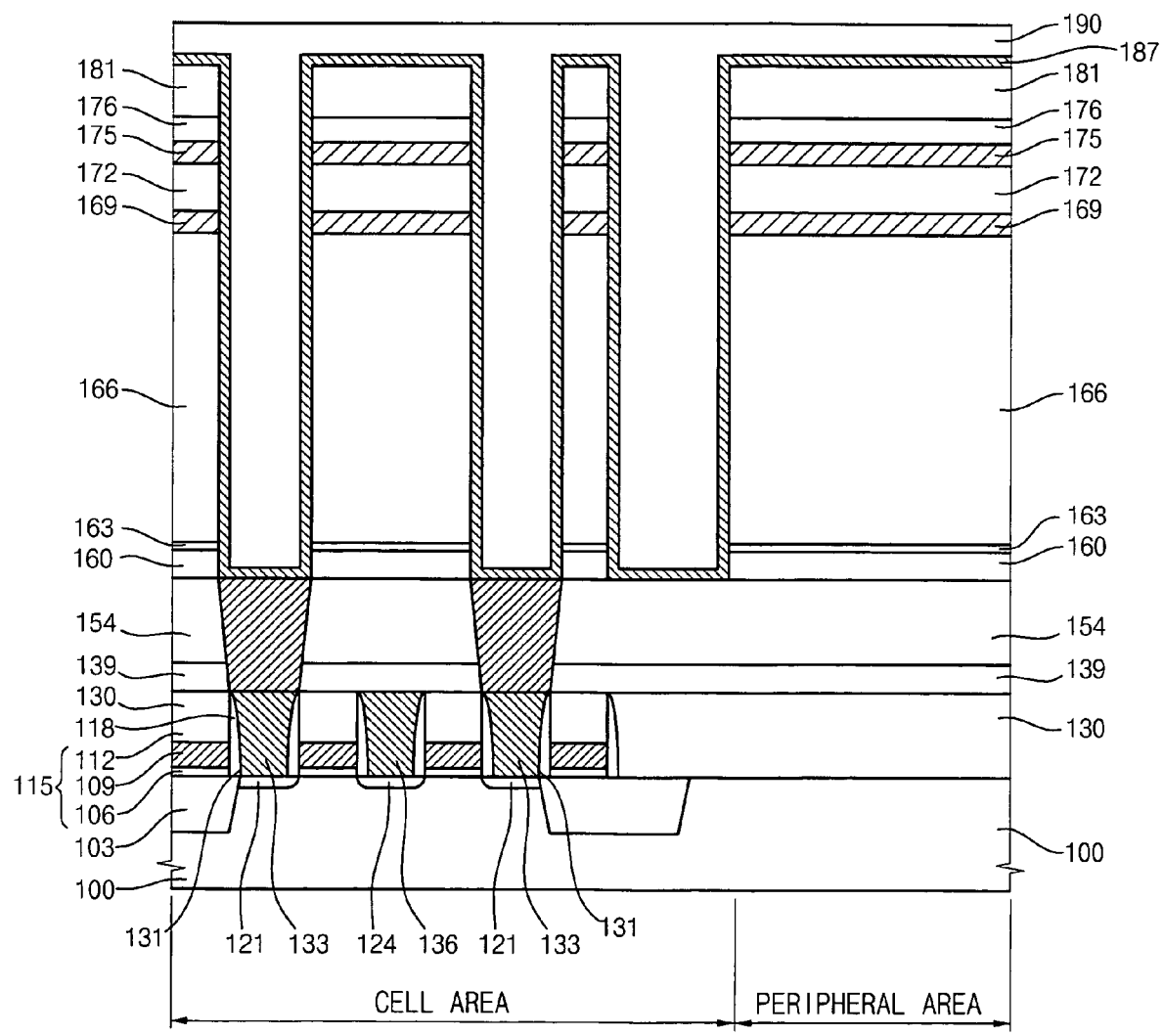
FIGS. 12 and 13 are cross-sectional views illustrating a processing step for forming a conductive layer and a second sacrificial layer on an inner surface of the first and second openings.
Figure 13:
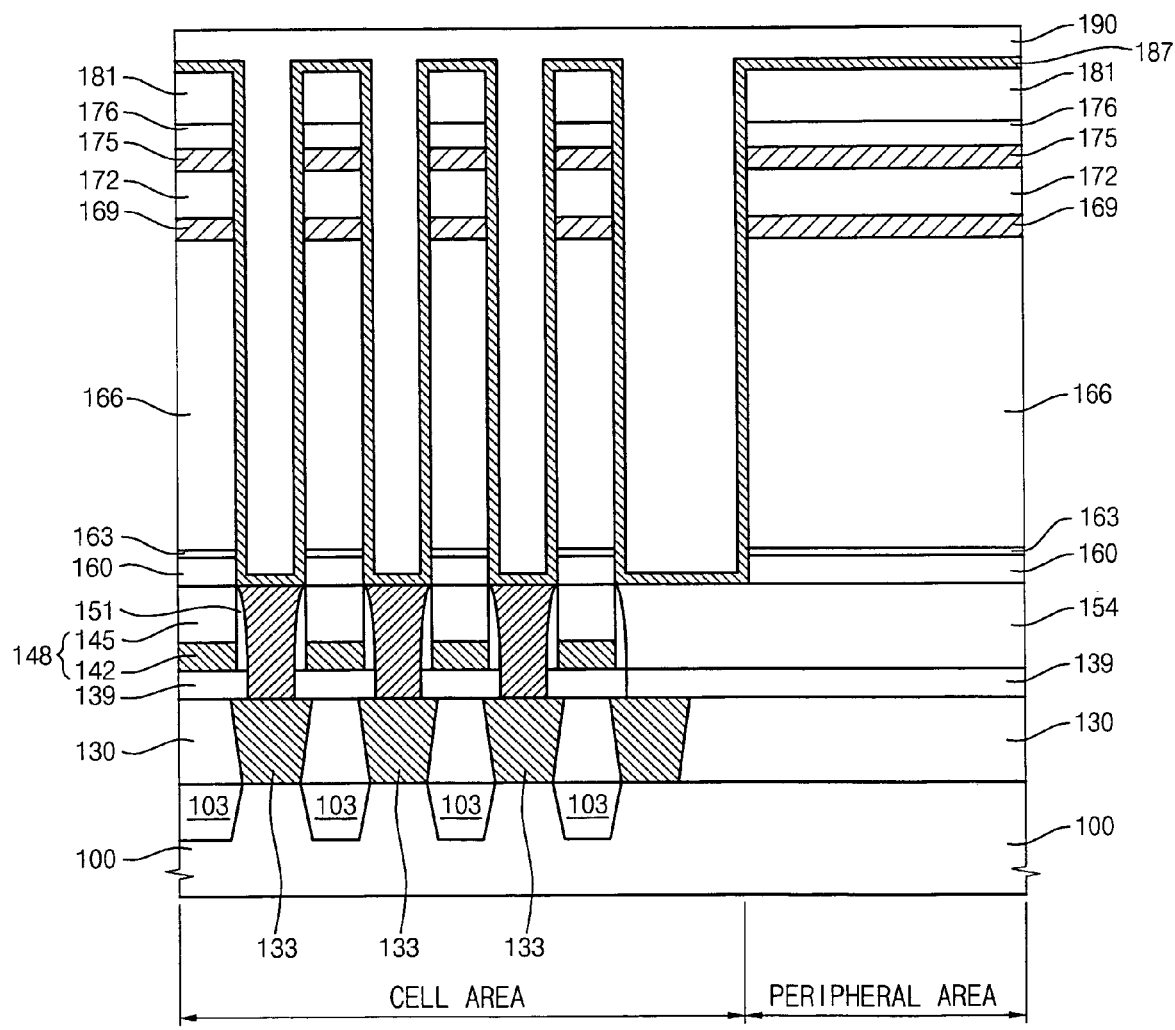

FIGS. 12 and 13 are cross-sectional views illustrating a processing step for forming a conductive layer and a second sacrificial layer on an inner surface of the first and second openings. FIG. 12 is a cross-sectional view taken along the line I-I of FIG. 9, and FIG. 13 is a cross-sectional view taken along the line II-II of FIG. 9.

Referring to FIGS. 12 and 13, a guide conductive layer 187 for forming a storage electrode and a guide ring is formed on the fourth pad 157, the storage node mask 181, and on inner surfaces of the first and second openings 184 and 185. In the present embodiment, the guide conductive layer 187 comprises a doped polysilicon highly doped with N type or P type impurities, and is formed by a low pressure CVD process or a doping process to thereby have a uniform thickness.

A second sacrificial layer 190 is formed on the guide conductive layer 187 to a sufficient thickness to fill the first and second openings 184 and 185, and may include an oxide layer such as a boron phosphorous silicate glass (BPSG) layer, a phosphorous silicate glass (PSG) layer, an undoped silicate glass (USG) layer, a spin on glass (SOG) layer, a tetraethylorthosilicate (TEOS) layer, and an oxide layer formed by a high-density plasma CVD process. In the present embodiment, the second sacrificial layer 190 comprises the same material as the mold layer 166 and the first sacrificial layer 172. The second sacrificial layer 190 protects the storage electrode and the guide ring while forming the storage electrode and the guide ring from the guide conductive layer 187.

Figure 14:
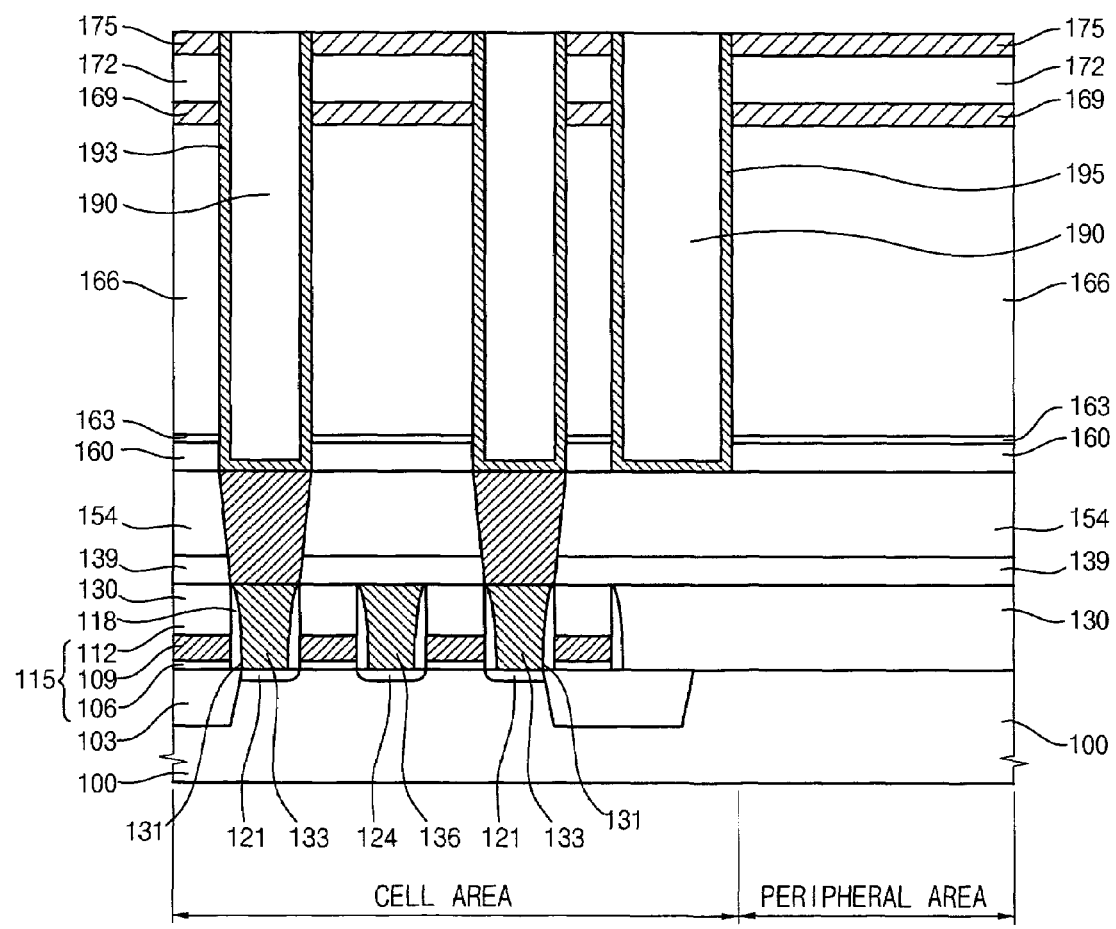
FIGS. 14 and 15 are cross-sectional views illustrating a processing step for forming a storage electrode on an inner surface of the first opening and a guide ring on an inner surface of the second opening.
Figure 15:
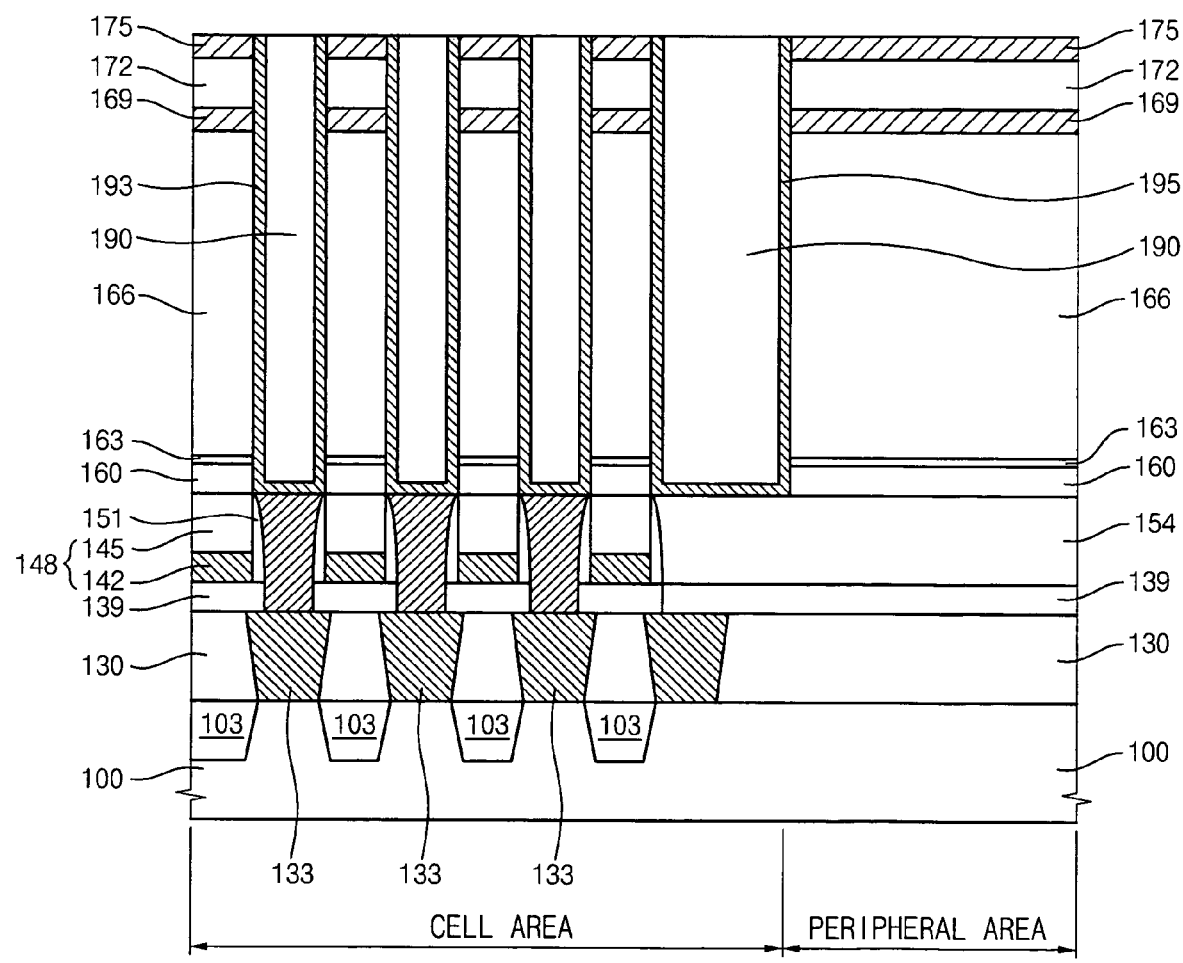

FIGS. 14 and 15 are cross-sectional views illustrating a processing step for forming a storage electrode on an inner surface of the first opening and a guide ring on an inner surface of the second opening. FIG. 14 is a cross-sectional view taken along the line I-I of FIG. 9, and FIG. 15 is a cross-sectional view taken along the line II-II of FIG. 9.

Referring to FIGS. 14 and 15, an upper portion of the second sacrificial layer 190 in the first and second openings 184 and 185, and a portion of the guide conductive layer 187, the storage node mask 181 and the buffer oxide layer 176 on the polishing stop layer 175 are removed, so that a top surface of the polishing stop layer 175 is exposed and the sacrificial layer 190 and the guide conductive layer 187 only remain in the first and second openings 184 and 185. In the present embodiment, the second sacrificial layer 190, the guide conductive layer 187, the storage node mask 181, and the buffer oxide layer 176 are removed and planarized by a CMP process, until the top surface of the polishing stop layer 175 is exposed. The polishing stop layer 175 functions as a barrier layer against the mechanical polishing and a chemical reaction with a slurry for the chemical polishing in the CMP process, so that the storage electrode 193 has the same height as the guide ring 195.

Figure 16:
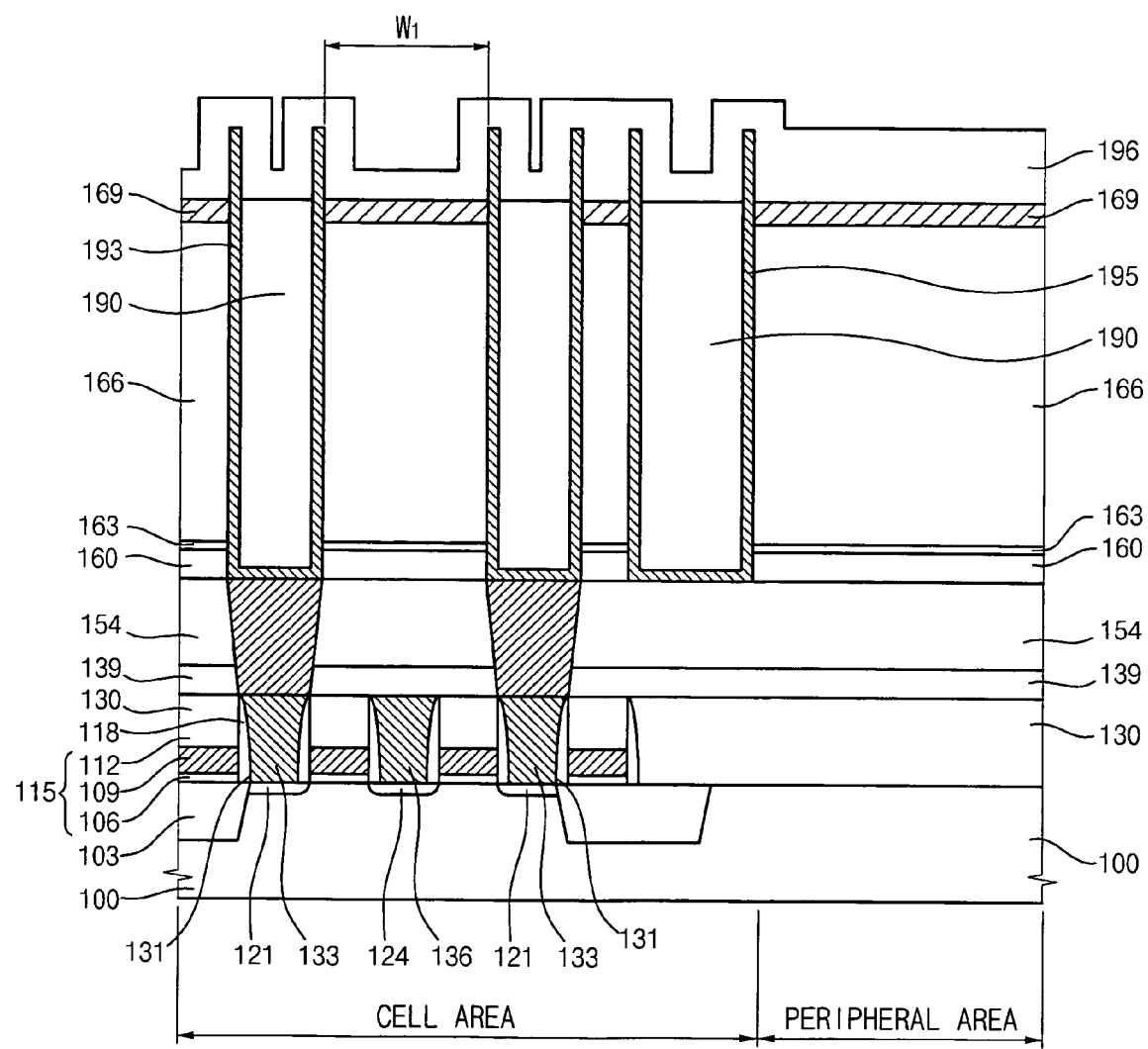
FIGS. 16 and 17 are cross-sectional views illustrating a processing step for forming a spacer oxide layer on the support layer and on an upper sidewall of the storage electrode and the guide ring shown in FIGS. 14 and 15.
Figure 17:
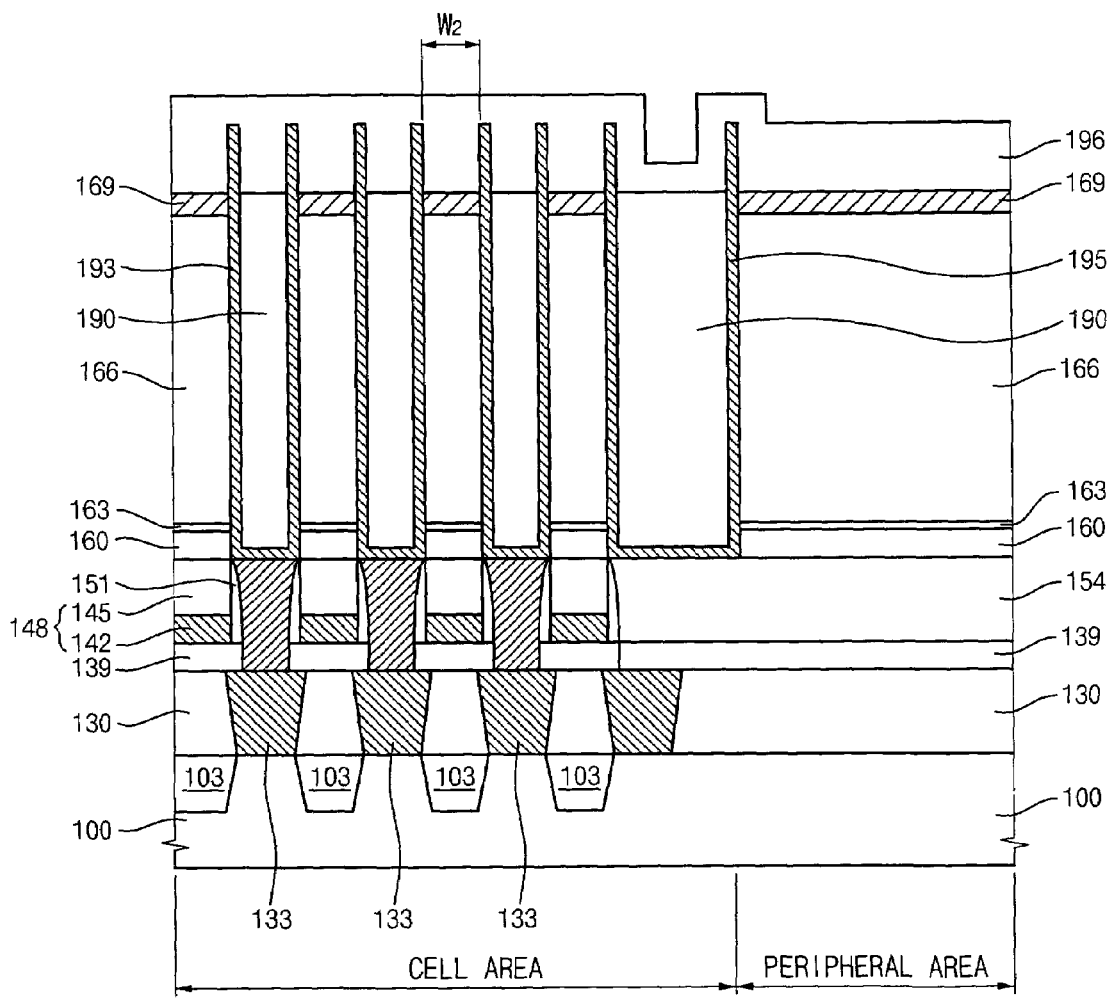

FIGS. 16 and 17 are cross-sectional views illustrating a processing step for forming a spacer oxide layer on the support layer and on an upper sidewall of the storage electrode and the guide ring shown in FIGS. 14 and 15. FIG. 16 is a cross-sectional view taken along the line I-I of FIG. 9, and FIG. 17 is a cross-sectional view taken along the line II-II of FIG. 9.

Referring to FIGS. 16 and 17, when the CMP process is completed so that the storage electrode 193 has the same height as the guide ring 195, the polishing stop layer 175 remaining on the first sacrificial layer 172 is removed by a conventional etching process, and then the first sacrificial layer 172 is removed from the support layer 169 by an etching process using a Limulus Amoebocyte Lysate (LAL) etchant. An upper portion of the second sacrificial layer 190 in the first and second openings 184 and 185 is also removed in the etching process for removing the first sacrificial layer 172, until a top surface of the second sacrificial layer 190 is the same level of the top surface of the support layer 169. As a result, upper portions of the storage electrode 193 and the guide ring 195 are protruded from the top surface of the support layer 169 and the top surface of the second sacrificial layer 190 in the first and second openings 184 and 185.

A spacer oxide layer 196 is formed on the top surfaces of the support layer 169 and the second sacrificial layer 190, and on sidewalls of exposed upper portions of the storage electrodes 193 and the guide ring 195. In the present embodiment, though having a strong dependence on an underlying layer, an atmospheric pressure CVD (APCVD) process may be utilized for forming the spacer oxide layer 196, since the storage electrode 193 and the guide ring 195 have uniform heights. Accordingly, the gap between the storage electrodes 193 is sufficiently filled up with the spacer oxide layer 196 in the second direction without a void. Here, the spacer oxide layer 196 is formed to be thicker in the peripheral region than in the cell region in which the upper portion of the storage electrode 193 is exposed due to a micro loading effect caused by a pattern density difference therebetween.

Figure 18:
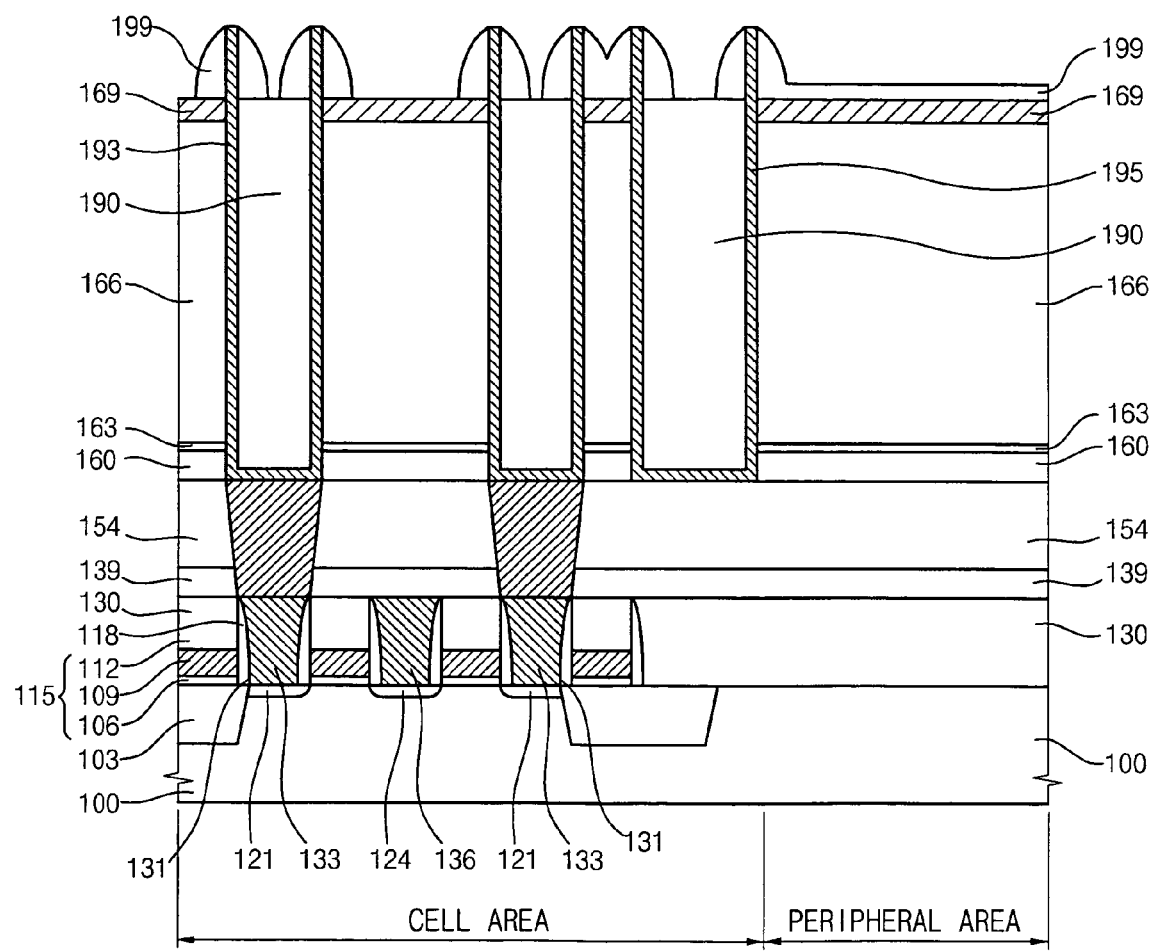
FIGS. 18 and 19 are cross-sectional views illustrating a processing step for forming an oxide spacer on an upper sidewall of the storage electrode and the guide ring shown in FIGS. 14 and 15.
Figure 19:
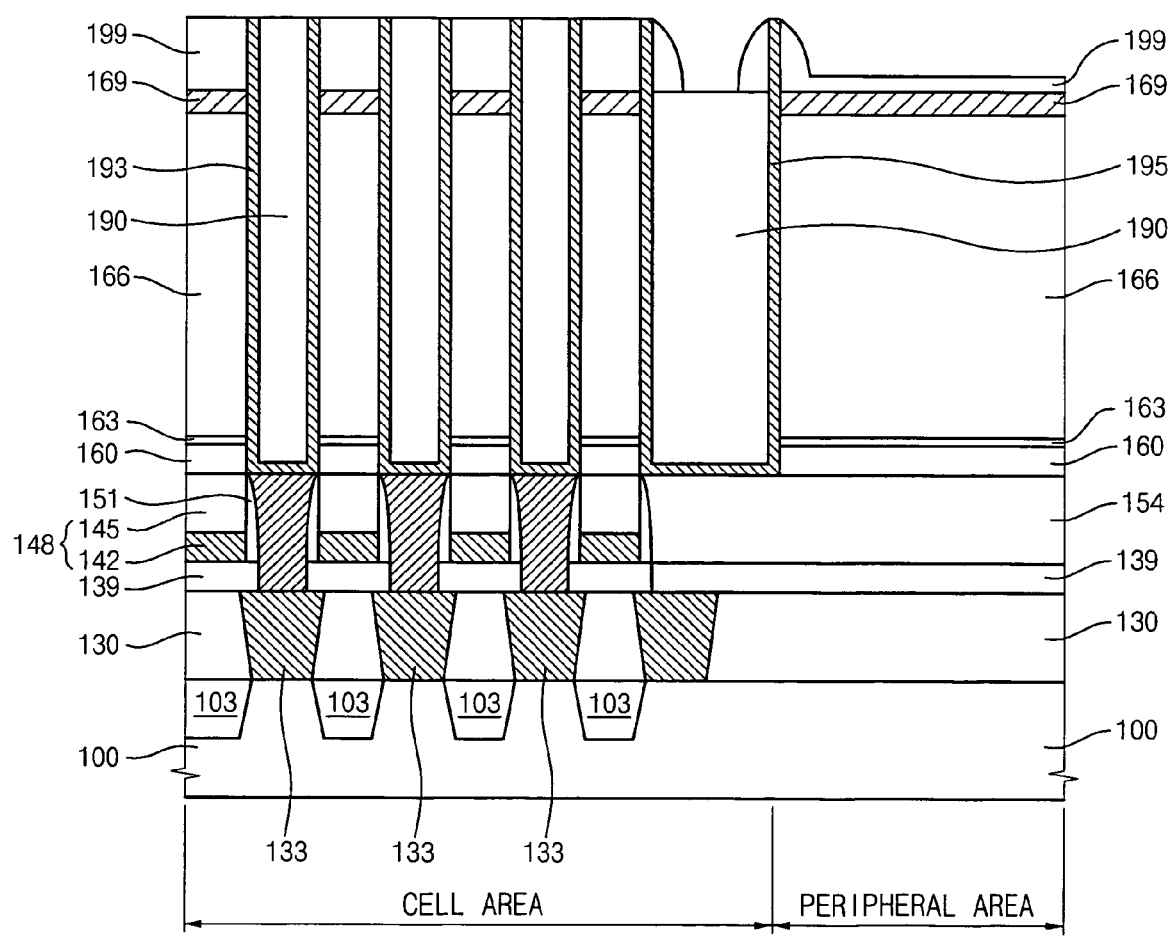

FIGS. 18 and 19 are cross-sectional views illustrating a processing step for forming an oxide spacer on an upper sidewall of the storage electrode and the guide ring shown in FIGS. 14 and 15. FIG. 18 is a cross-sectional view taken along the line I-I of FIG. 9, and FIG. 19 is a cross-sectional view taken along the line II-II of FIG. 9.

Figure 20:
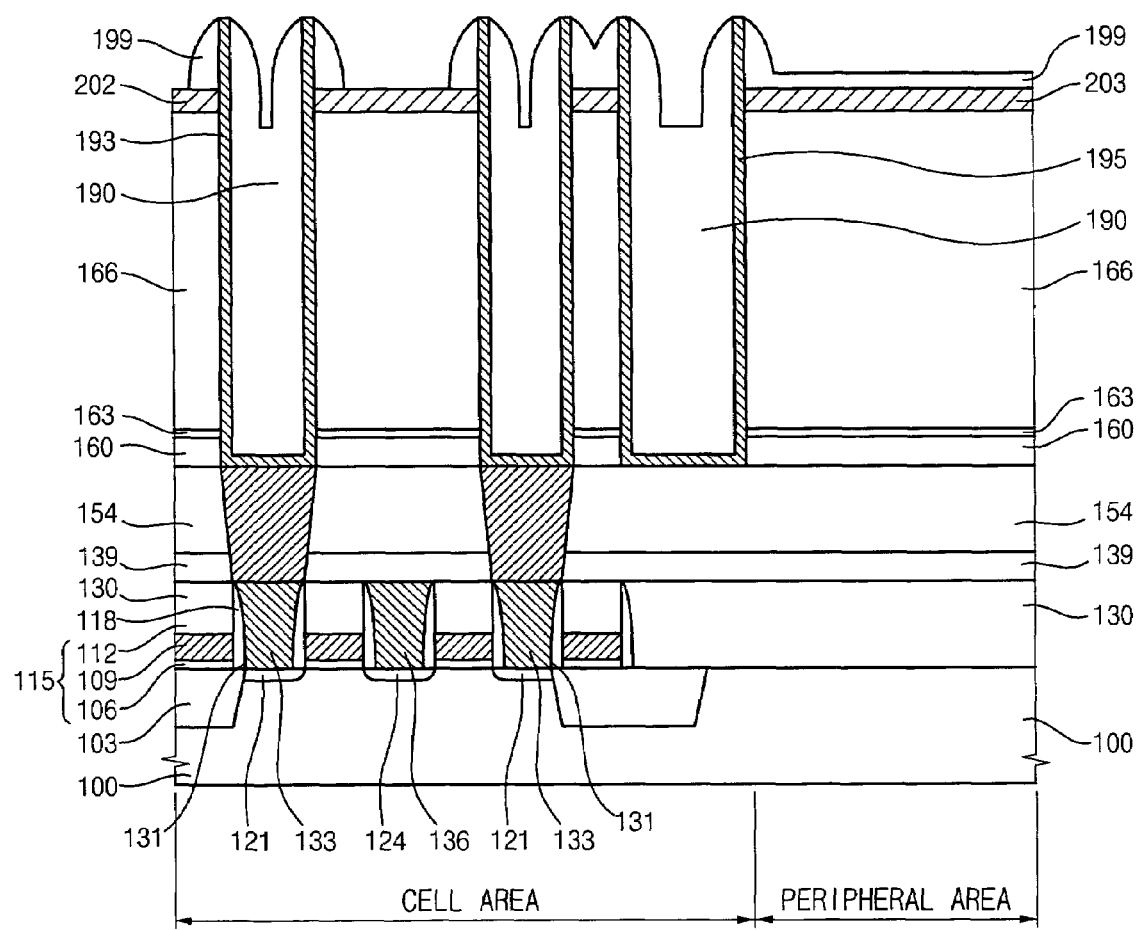
FIGS. 20 and 21 are cross-sectional views illustrating a processing step for forming the support layer shown in FIGS. 18 and 19 into a first support pattern and a second support pattern.
Figure 21:
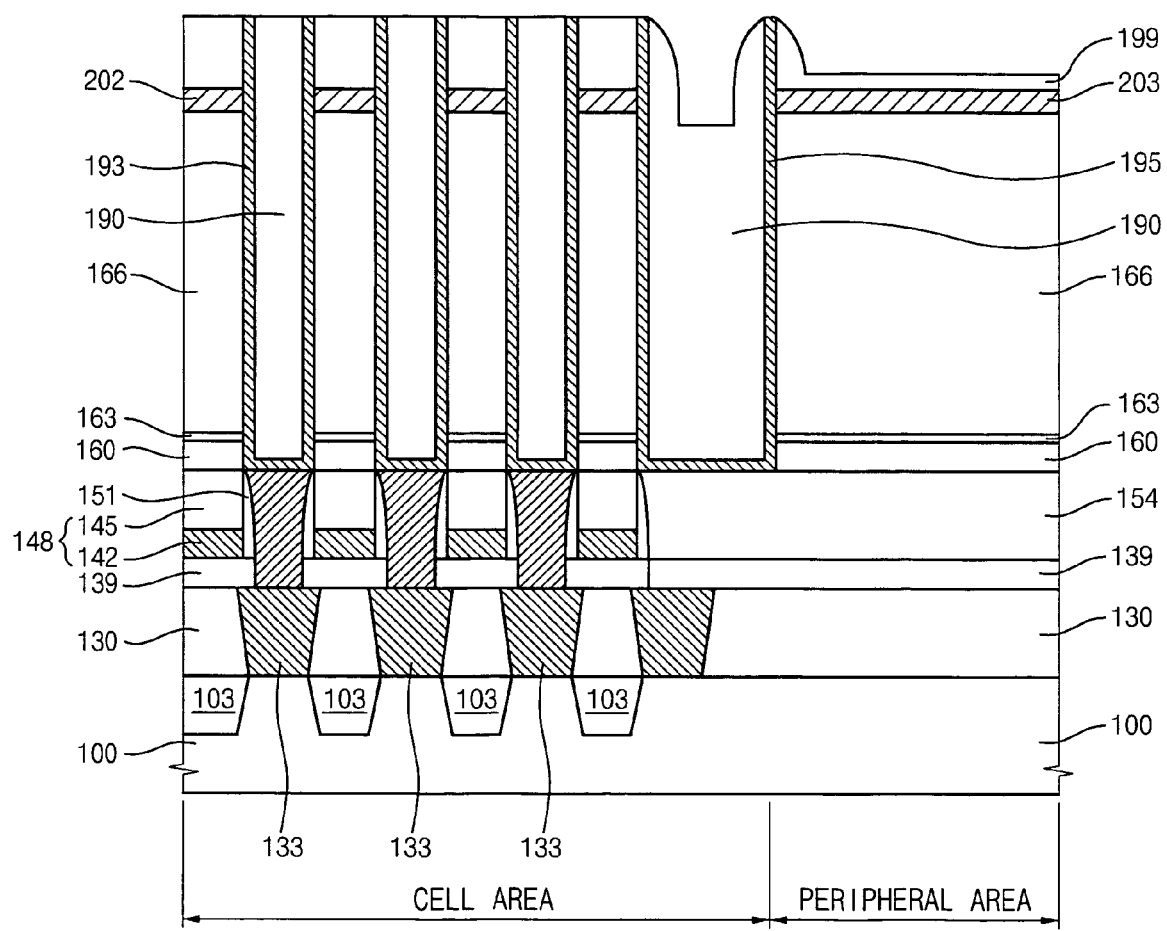

FIGS. 20 and 21 are cross-sectional views illustrating a processing step for forming the support layer shown in FIGS. 18 and 19 into a first support pattern and a second support pattern. FIG. 20 is a cross-sectional view taken along the line I-I of FIG. 9, and FIG. 21 is a cross-sectional view taken along the line II-II of FIG. 9.

Referring to FIGS. 18 to 21, a conventional anisotropic etching process is performed on the spacer oxide layer 196 to thereby form an oxide spacer 199 on the upper sidewalls of the storage electrode 193 and the guide ring 195. A first interval W1 (FIG. 16) between the storage electrodes 193 in the first direction is larger than a second interval W2 (FIG. 17) between the storage electrodes 193 in the second direction, and thus the support layer 169 is exposed through the storage electrodes 193 in the first direction while the support layer 169 is not exposed through the storage electrodes 193 in the second direction.

In addition, a third interval between the storage electrode 193 and the guide ring 195 in the first direction and a fourth interval between the storage electrode 193 and the guide ring 195 in the second direction are smaller than or equal to the second interval W2, so that the support layer 169 is not exposed through the third interval or the fourth interval. As described above, the spacer oxide layer 196 is formed to be thicker in the peripheral region than in the cell region, thus the spacer oxide layer 196 still remains in the peripheral region even though the anisotropic etching process is performed on the spacer oxide layer 196, so that the support layer 169 in the peripheral region is also not exposed.

As a result, the support layer 169 exposed through the first interval W1 is removed in the first direction, so that the storage electrodes 193 are spaced apart from each other in the first direction, and are connected with each other in the second direction by the support layer 169. That is, a partial etching against the support layer 169 forms a mesh-shaped first support pattern 202 surrounding and supporting the storage electrodes adjacent to each other, and thus a structural stability is remarkably improved due to the first support pattern 202.

The support layer 169 exposed through the second interval W2 is not removed while the oxide spacer 199 and the first support pattern 202 are formed, since the gap between the storage electrodes 193 is sufficiently filled with the spacer oxide layer 196 in the second direction without a void. In addition, the support layer 169 is not exposed through the third and the fourth distance, so that the support layer 169 is not removed while the oxide spacer 199 and the first support pattern 202 are formed. Further, the spacer oxide layer 196 still remains on the support layer 169 in the peripheral region, thus the support layer 169 is not removed while the oxide spacer 199 and the first support pattern 202 are formed. The support layer 169 in the peripheral region is formed into a second support pattern 203 for preventing the mold layer 166 underlying the support layer 169 from being etched away.

Figure 22:
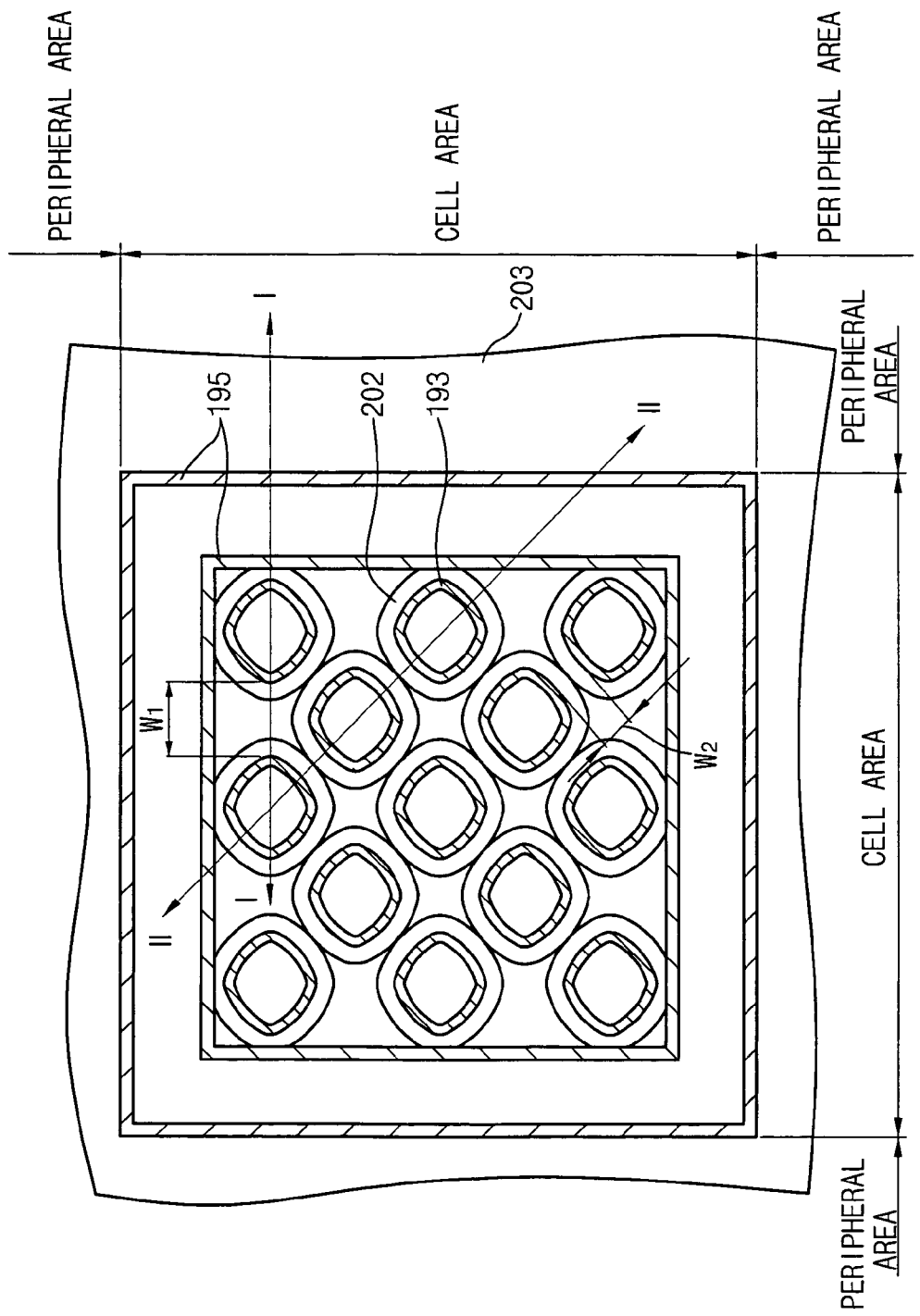
FIG. 22 is a plan view illustrating a capacitor including the storage electrode and the guide ring according to an exemplary embodiment of the present invention.
Figure 23:
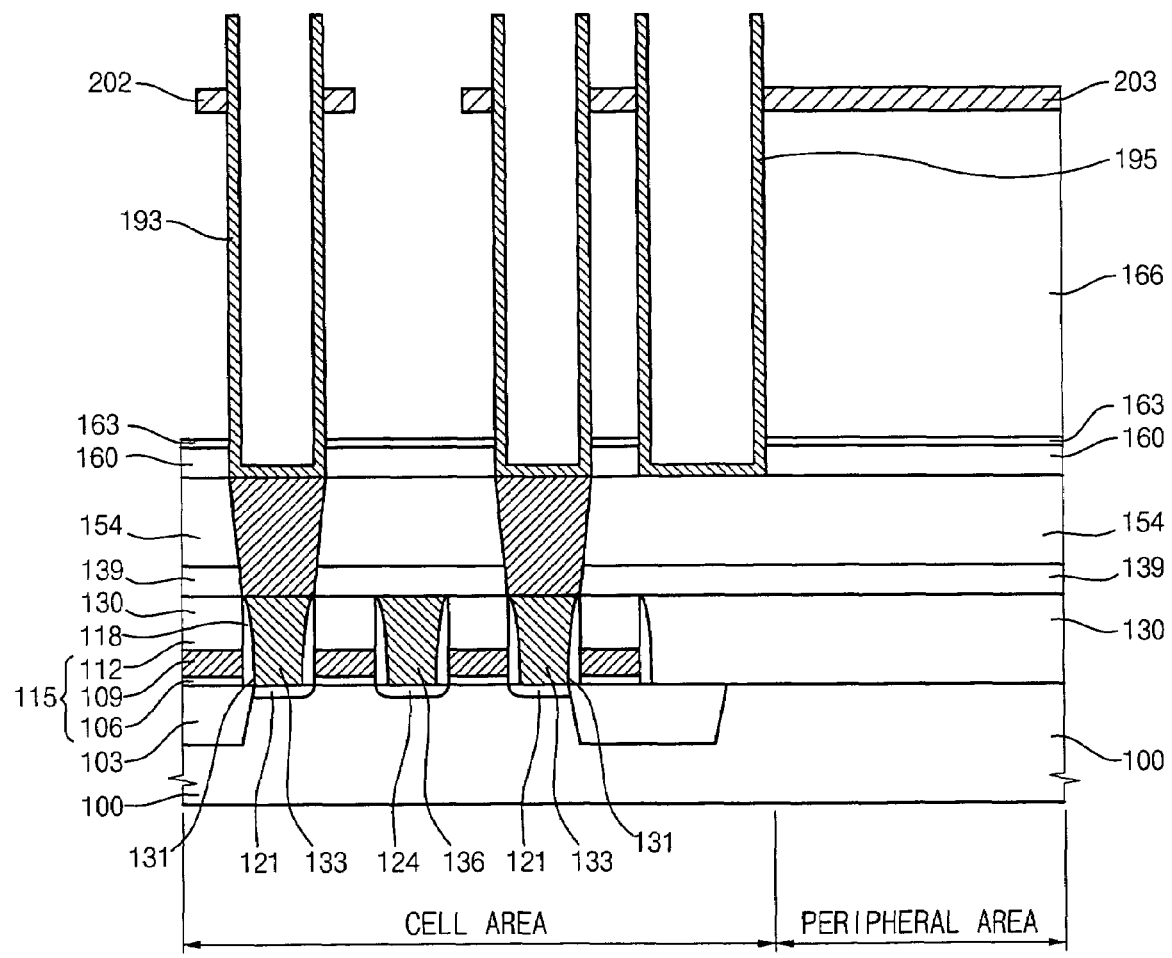
FIGS. 23 and 24 are cross-sectional views illustrating the storage electrode and the guide ring shown in FIG. 22.
Figure 24:
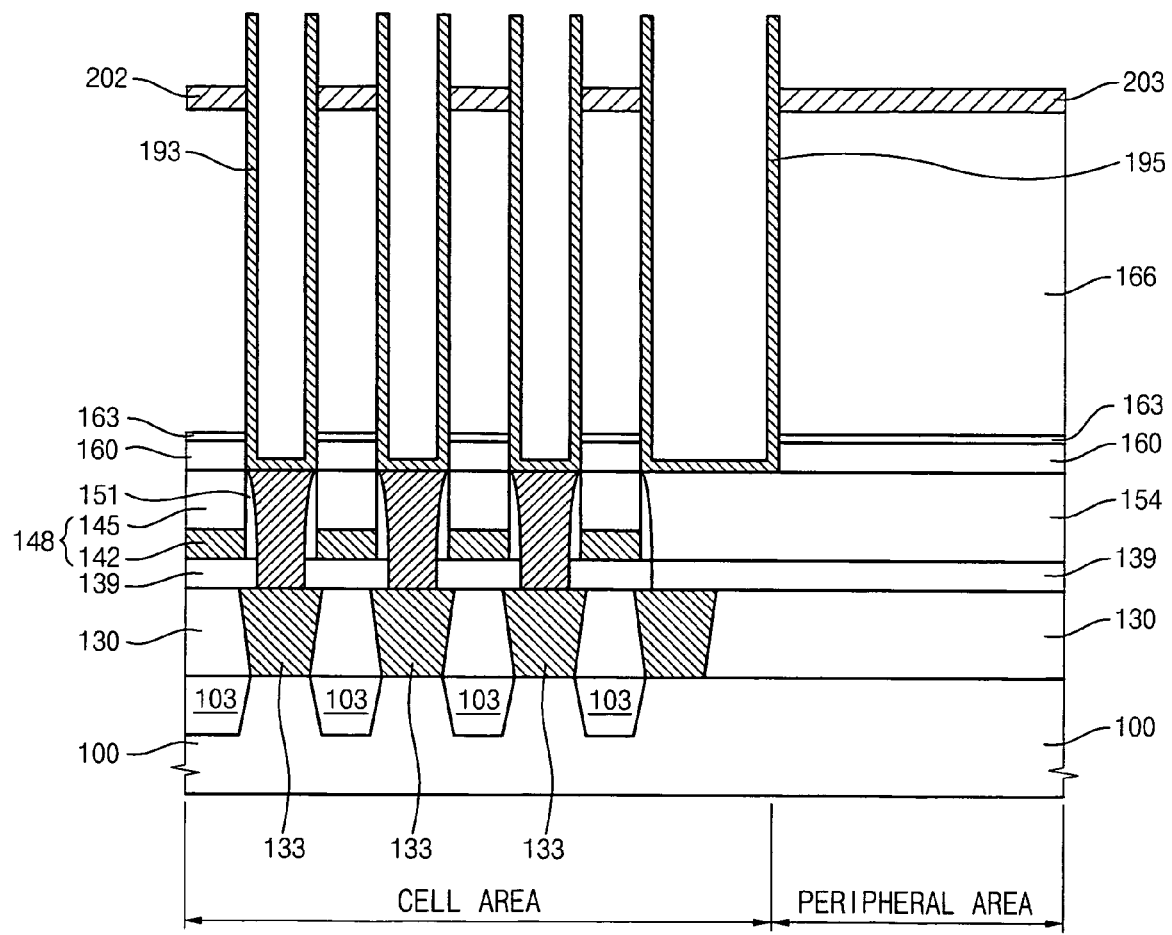

FIG. 22 is a plan view illustrating a capacitor including the storage electrode and the guide ring according to an exemplary embodiment of the present invention. FIGS. 23 and 24 are cross-sectional views illustrating the storage electrode and the guide ring shown in FIG. 22. FIG. 23 is a cross-sectional view taken along the line I-I of FIG. 22, and FIG. 24 is a cross-sectional view taken along the line II-II of FIG. 22.

Referring to FIGS. 22 to 24, the exposed mold layer 166 and the oxide spacer 199 are removed by an isotropic etching process, such as a wet etching process using a predetermined etchant and a chemical dry etching process using an etching gas. Examples of the etchant include an etchant comprising hydrogen fluoride; an etchant comprising ammonium hydroxide (NH4OH), hydrogen peroxide, and de-ionized water; a LAL etchant comprising ammonium fluoride, hydrogen fluoride, and distilled water, etc. These can be used alone or in combinations thereof. Examples of the etching gas include a mixture gas of hydrogen fluoride gas and water vapor, a mixture gas of carbon fluoride and oxygen, etc. These can also be used alone or in combinations thereof.

The above isotropic etching process removes the oxide spacer 199 in the peripheral region, but does not remove the mold layer 166 in the peripheral region, since the second support pattern 203 and the guide ring 195 protects the mold layer 166 in the peripheral region from the isotropic etching process. Accordingly, the mold layer 166 in the peripheral region remains on the etching layer 163 despite the isotropic etching process against the mold layer 166 and the oxide spacer 199.

Here, the first and second support patterns 202 and 203 have a sufficient etching resistance with respect to the mold layer 166 in the isotropic etching process or have a sufficient thickness, respectively, for preventing surface portions of the first and second support patterns 202 and 203 from being removed in the isotropic etching process for removing the mold layer 166. Accordingly, a thickness of the first and second support patterns 202 and 203 is determined in view of either a thickness of the mold layer 166 or an etching selectivity of the first and second support patterns 202 and 203 with respect to the mold layer 166.

Figure 25:
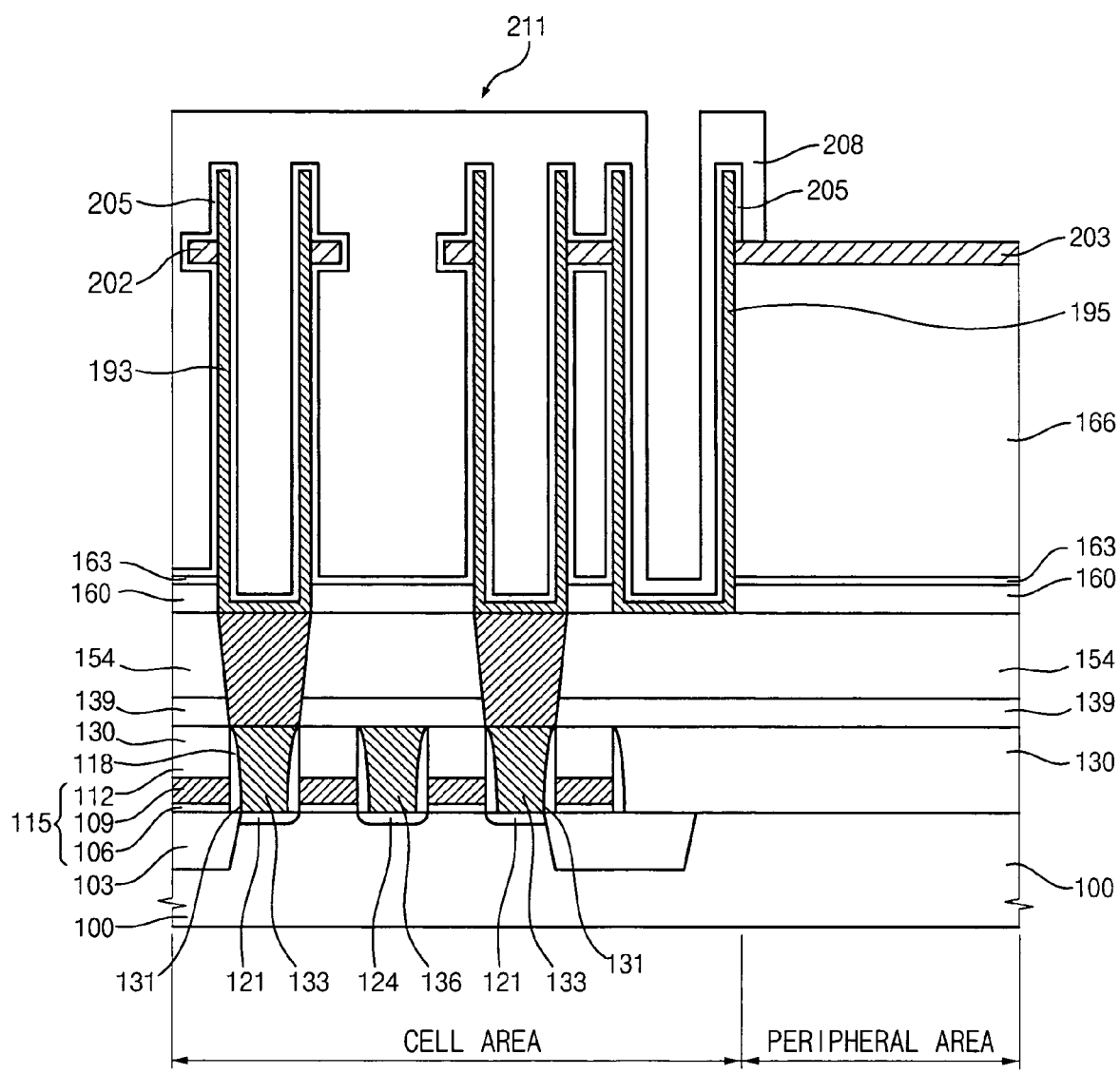
FIGS. 25 and 26 a cross-sectional views illustrating a processing step for forming a capacitor on the semiconductor substrate according to an exemplary embodiment of the present invention.
Figure 26:
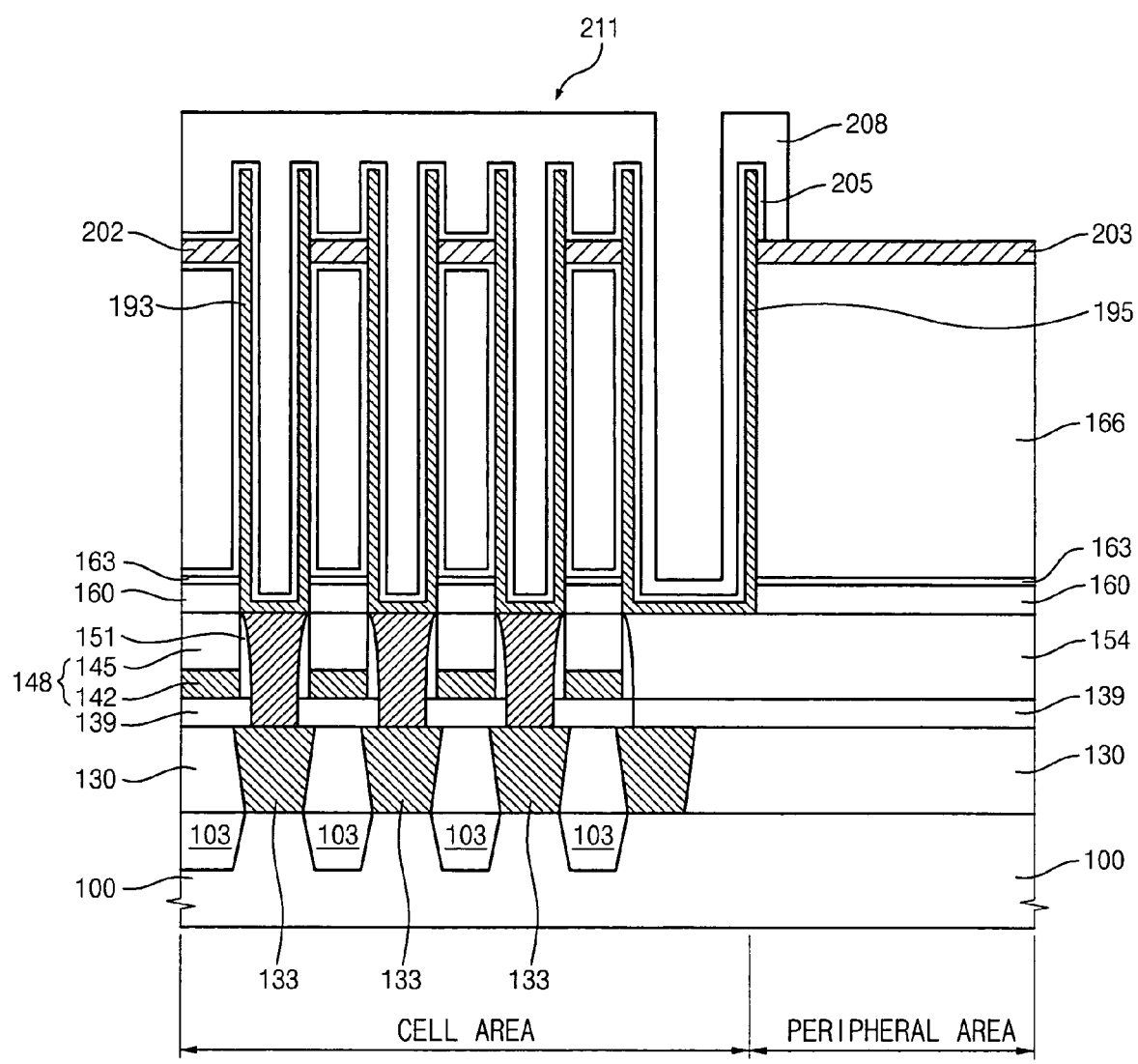

FIGS. 25 and 26 are cross-sectional views illustrating a processing step for forming a capacitor on the semiconductor substrate according to an exemplary embodiment of the present invention.

Referring to FIGS. 25 and 26, the adjacent storage electrodes 193 in the cell region are connected to each other by the first support pattern 202. In the peripheral region of the substrate 100 a dielectric layer 205 and a plate electrode 208 are sequentially formed on the storage electrode 193 and the guide ring 195 while the peripheral region is covered with the mold layer 166 and the second support pattern 203 to thereby complete the capacitor 211 of the present embodiment of the invention. The dielectric layer 205 and the plate electrode 208 extend over the storage electrode 193, the guide ring 195, and the first support pattern 202. The capacitors 211 are spaced apart from each other by a predetermined distance in the first direction, and are supported by adjacent capacitors 211 through the second support pattern 203. An outermost capacitor 211 and the guide ring 195 are supported by each other through the first support pattern 202. Accordingly, a step between the peripheral region and the cell region of the substrate 100 becomes very small even though the capacitor 211 is formed on the substrate 100.

Figure 27:
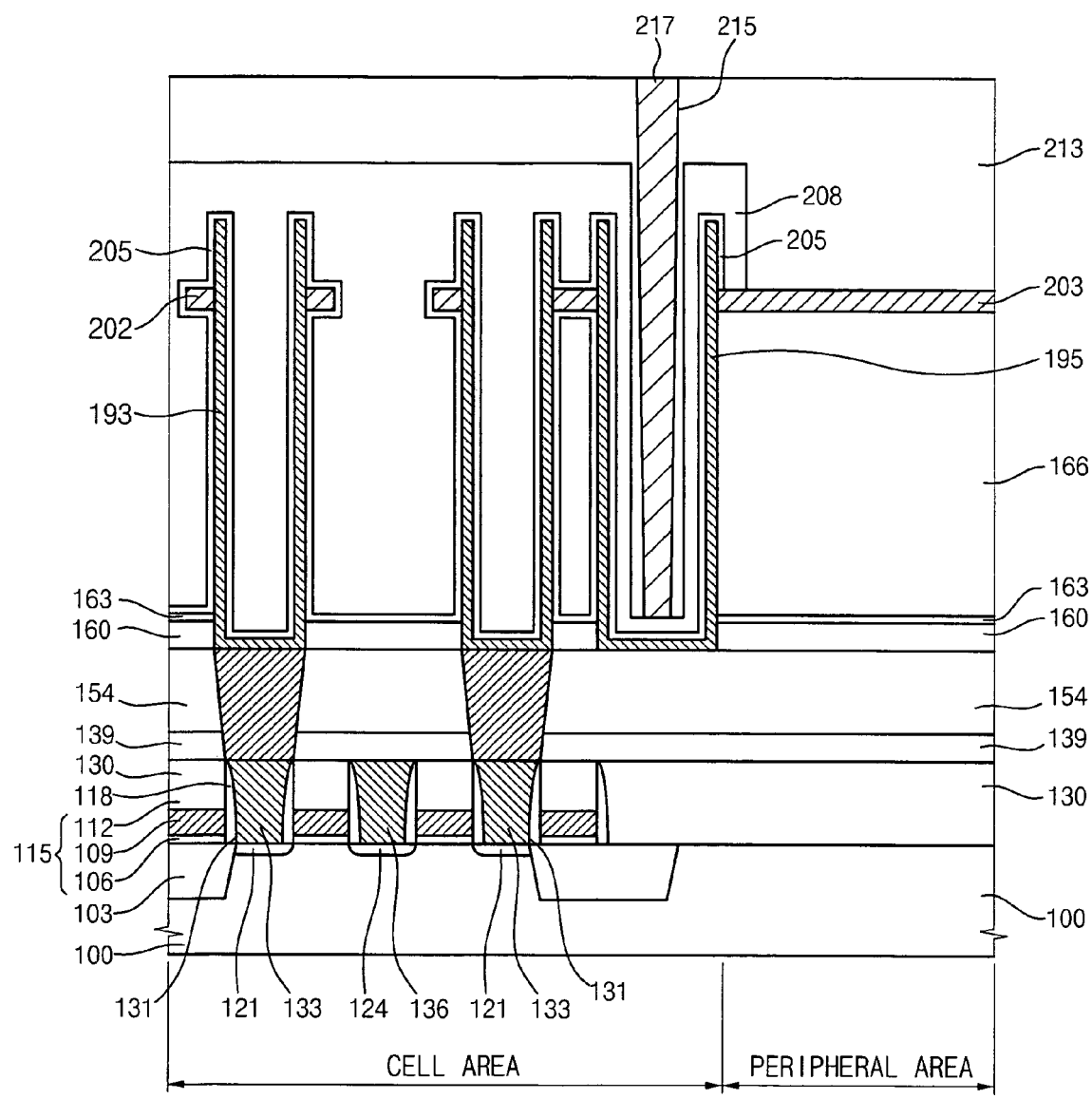
FIGS. 27 and 28 are views illustrating a processing step for forming a contact hole on the capacitor according to an exemplary embodiment of the present invention.
Figure 28:
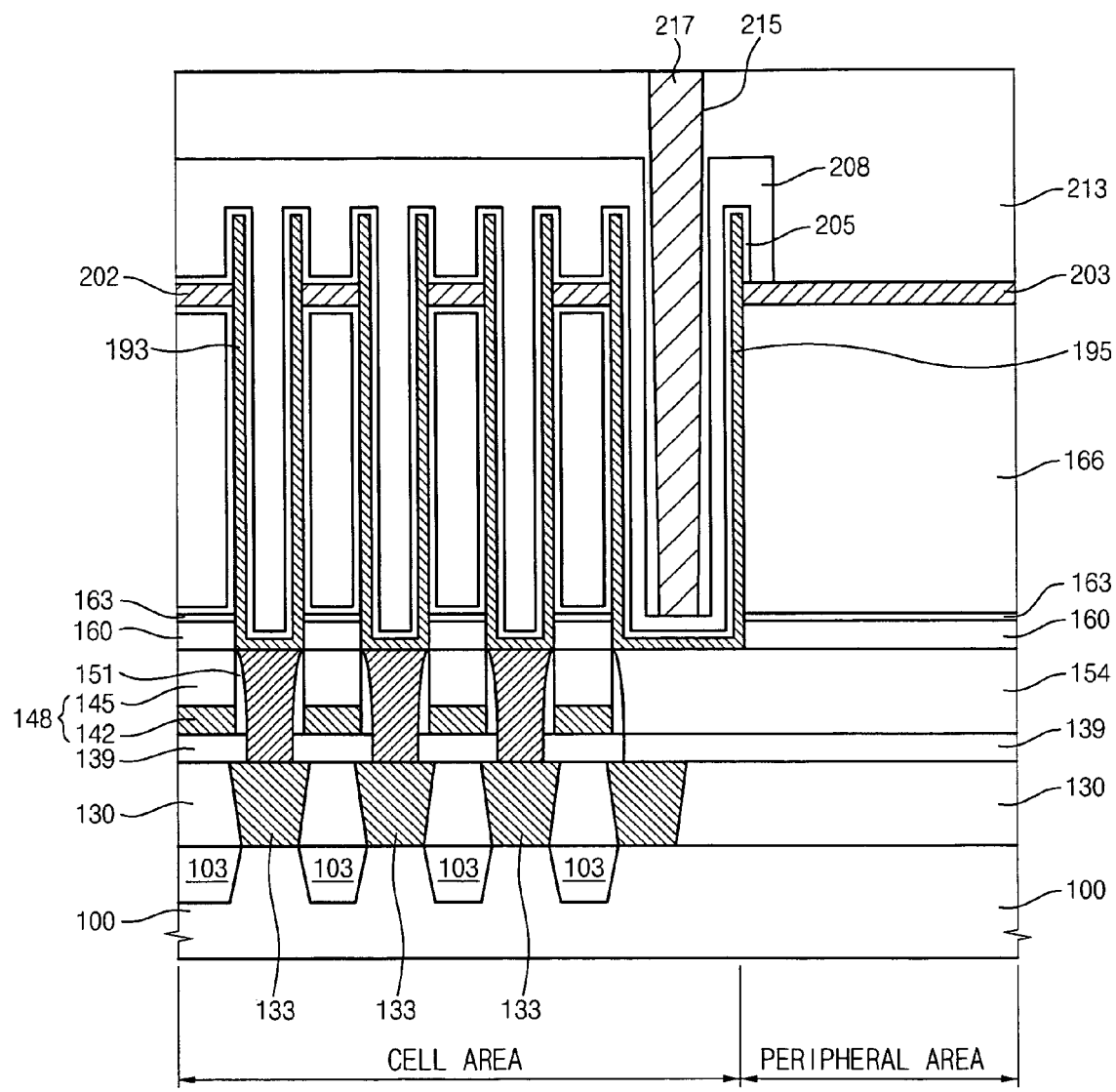

FIGS. 27 and 28 are views illustrating a processing step for forming a contact hole on the capacitor according to an exemplary embodiment of the present invention.

Referring to FIGS. 27 and 28, a fifth insulation interlayer 213 is formed on the above resultant structure on the substrate 100 including the cell region and the peripheral region, and is planarized by a conventional planarization process such as a CMP process. As a result, the fifth insulation interlayer 213 is formed on the plate electrode 208 in the cell region, and is formed on the second support pattern 203 in the peripheral pattern P.

A seventh photoresist pattern (not shown) is formed on the fifth insulation interlayer 213, and the fifth insulation interlayer 213 is anisotropically and partially etched to thereby form a fourth contact hole 215 through which the plate electrode 208 making contact with the guide ring 195 is exposed. In the present embodiment, the fourth contact hole 215 has a width smaller than the width of the second opening 185 since the plate electrode 208 in the second opening 185 is exposed through the fourth contact hole 215. The fourth contact hole 215 is filled with a conductive material to thereby form a metal contact plug 217 for electrically connecting upper circuit wirings to lower elements of a semiconductor device.

Thereafter, the upper circuit wirings are formed on the fifth insulation interlayer 213 to thereby complete the semiconductor device of the present embodiment.

Figure 29:
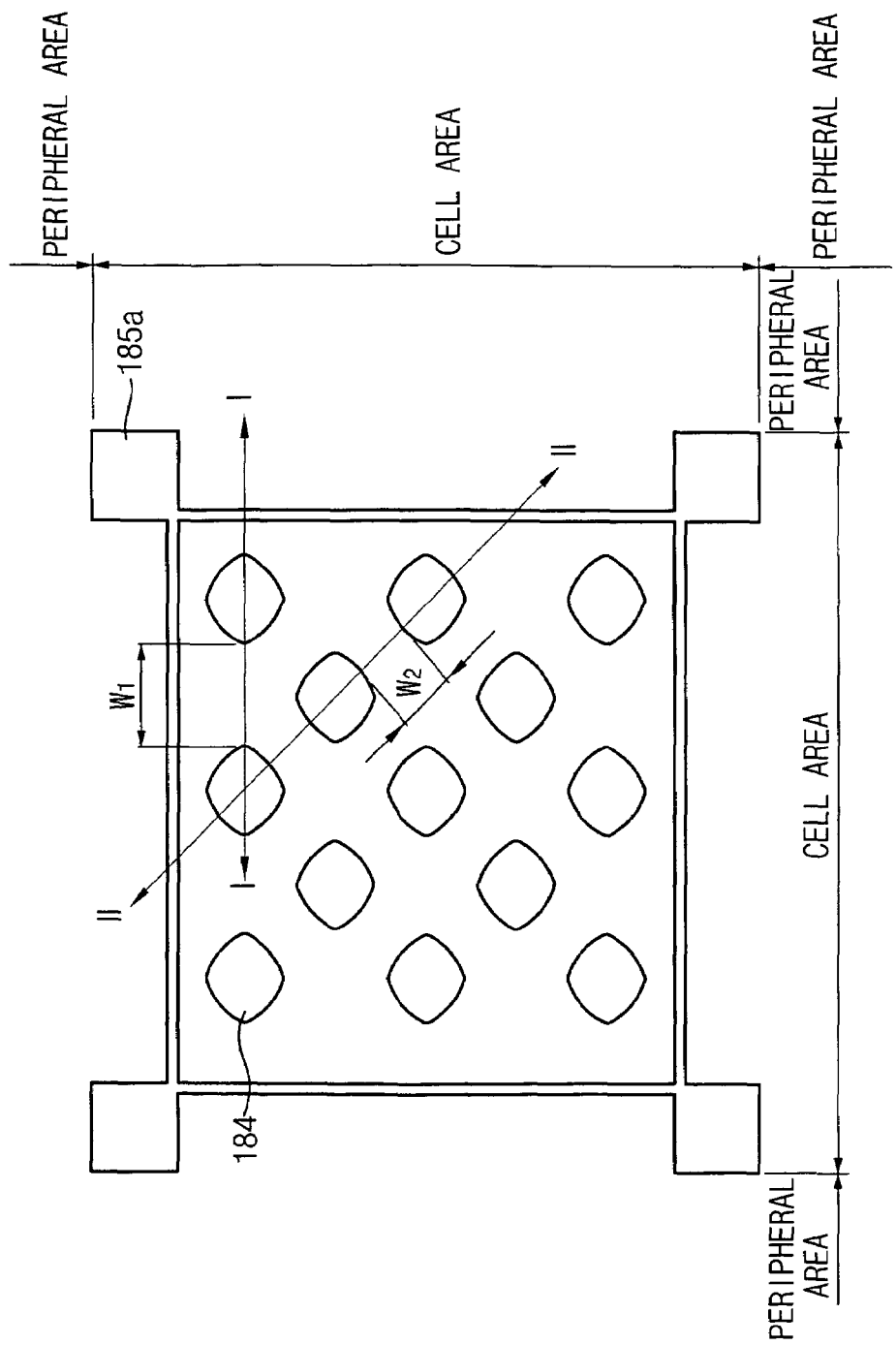
FIG. 29 is a plan view illustrating a first modified embodiment of the second opening shown in FIG. 9.

FIG. 29 is a plan view illustrating a first modified embodiment of the second opening shown in FIG. 9.

Although the above exemplary embodiment describes the second opening 185 formed around the cell region and surrounding the cell region with a uniform width shown in FIG. 9, the second opening can be modified so that its width is varied in accordance with the metal contact plug 217. In the present embodiment, the second opening is modified so that a corner portion thereof has a sufficient width to hold the metal contact plug 217 and a remaining portion, except the corner portion, has a relatively small width, as shown in FIG. 29.

Figure 30:
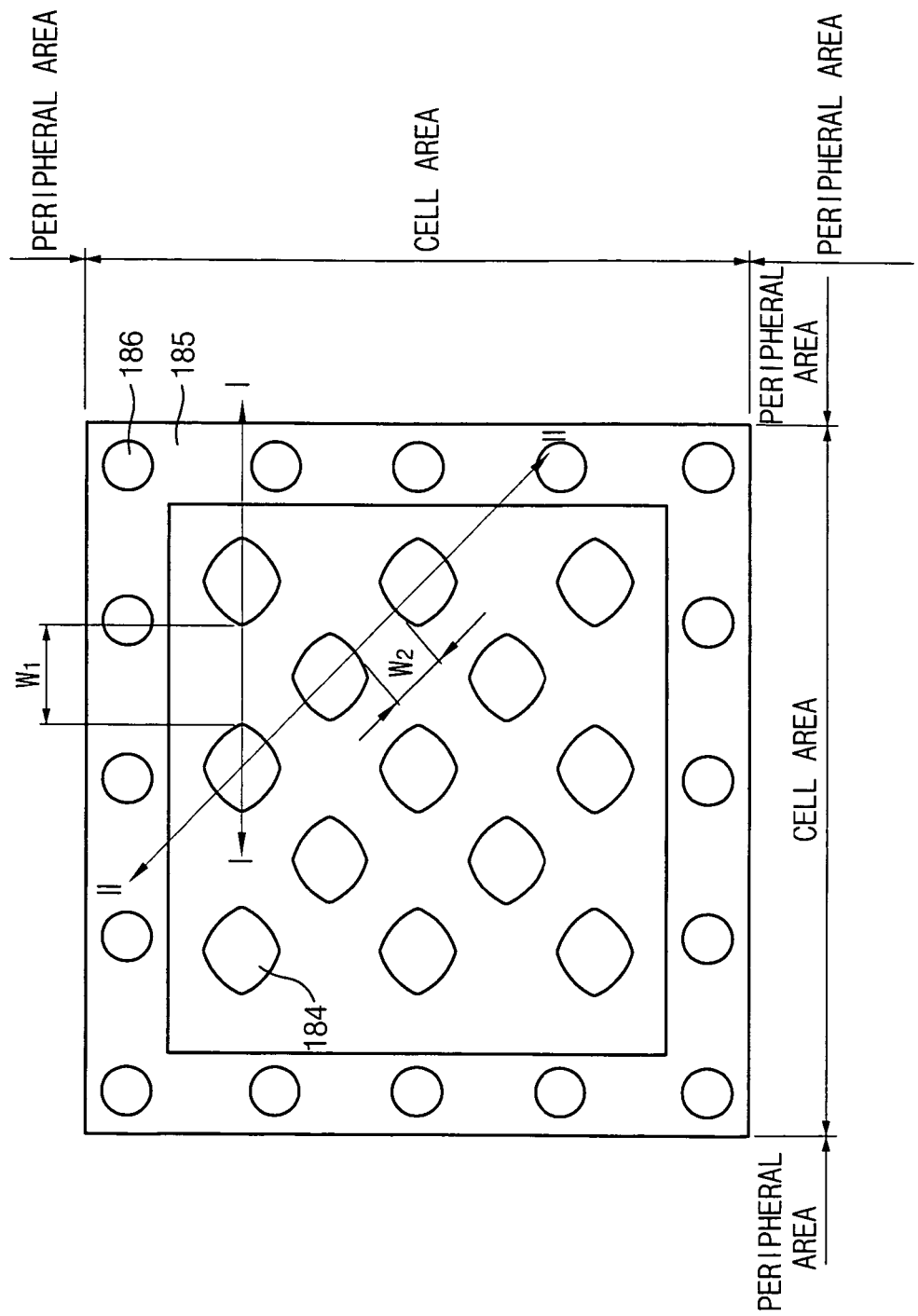
FIG. 30 is a plan view illustrating a second modified embodiment of the second opening shown in FIG. 9.
Figure 31:
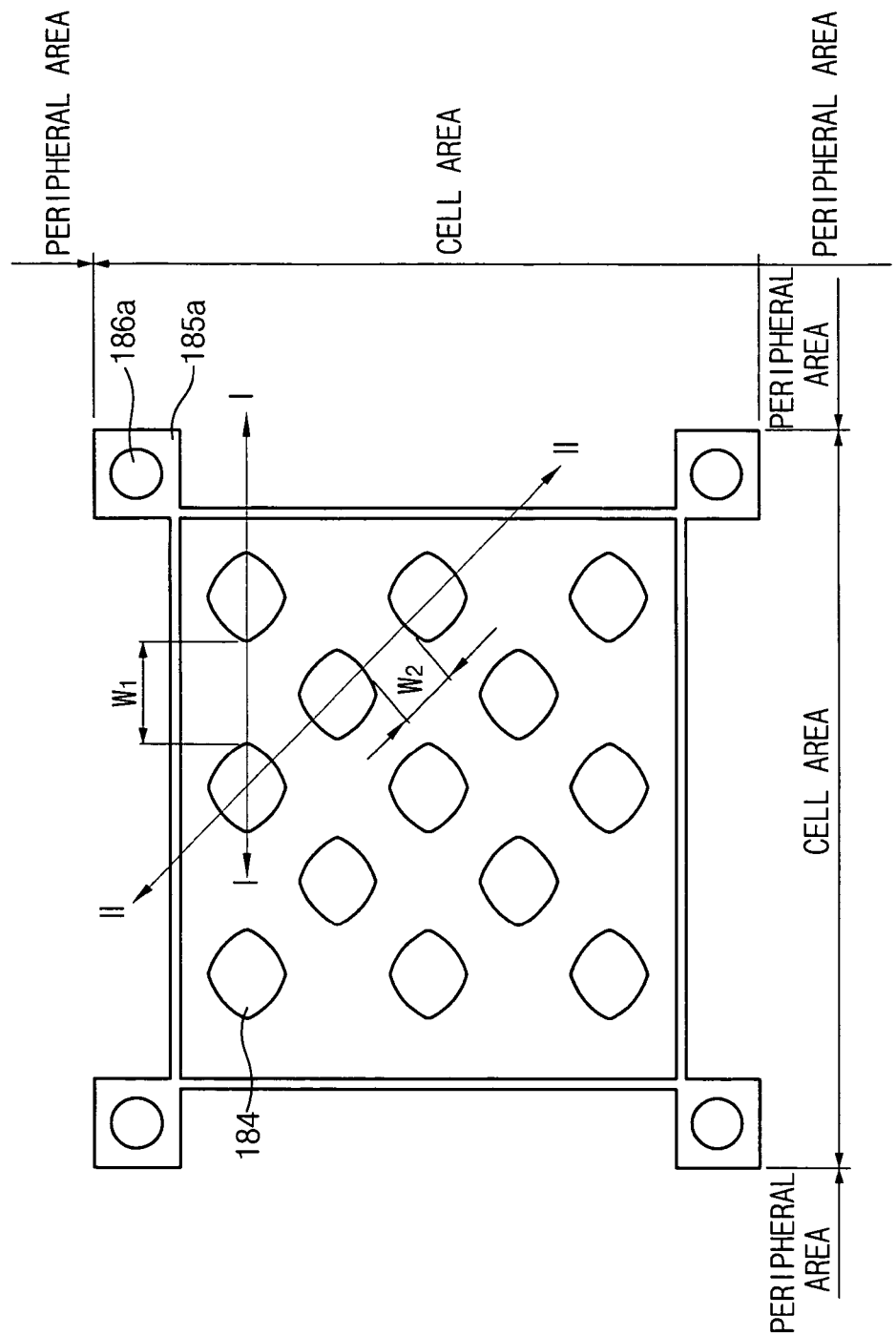
FIG. 31 is a plan view illustrating a re-modified embodiment of the first modified embodiment of the second opening shown in FIG. 29.

FIG. 30 is a plan view illustrating a second modified embodiment of the second opening shown in FIG. 9, and FIG. 31 is a plan view illustrating another modified embodiment of the first embodiment of the second opening shown in FIG. 29.

Referring to FIG. 30, the second opening 185 shown in FIG. 9 is otherwise modified so that a plurality of protruding portions 186 is formed in the second opening 185. The protruding portion 186 is vertically protruded from a bottom surface of the second opening 185. In a similar way, the first modified embodiment of the second opening 185a is re-modified so that a plurality of protruding portions 186a is formed in the corner portion of the first modified embodiment of the second opening 185a. The protruding portion 186a is vertically protruded from a bottom surface of the first modified embodiment of the second opening 185a. The protruding portion 186 and 186a facilitates a filling of the second opening 185 and the first modified embodiment of the second opening 185a with a conductive material after the guide ring 195 is formed in the second opening 185 and the first modified embodiment of the second opening 185a, respectively. Accordingly, when an insulation interlayer is formed on the capacitor, a void caused by a narrow width of the second opening 185 and the first modified embodiment of the second opening 185a is prevented since the guide ring 195 is completely buried in the insulation interlayer.

Figure 32:
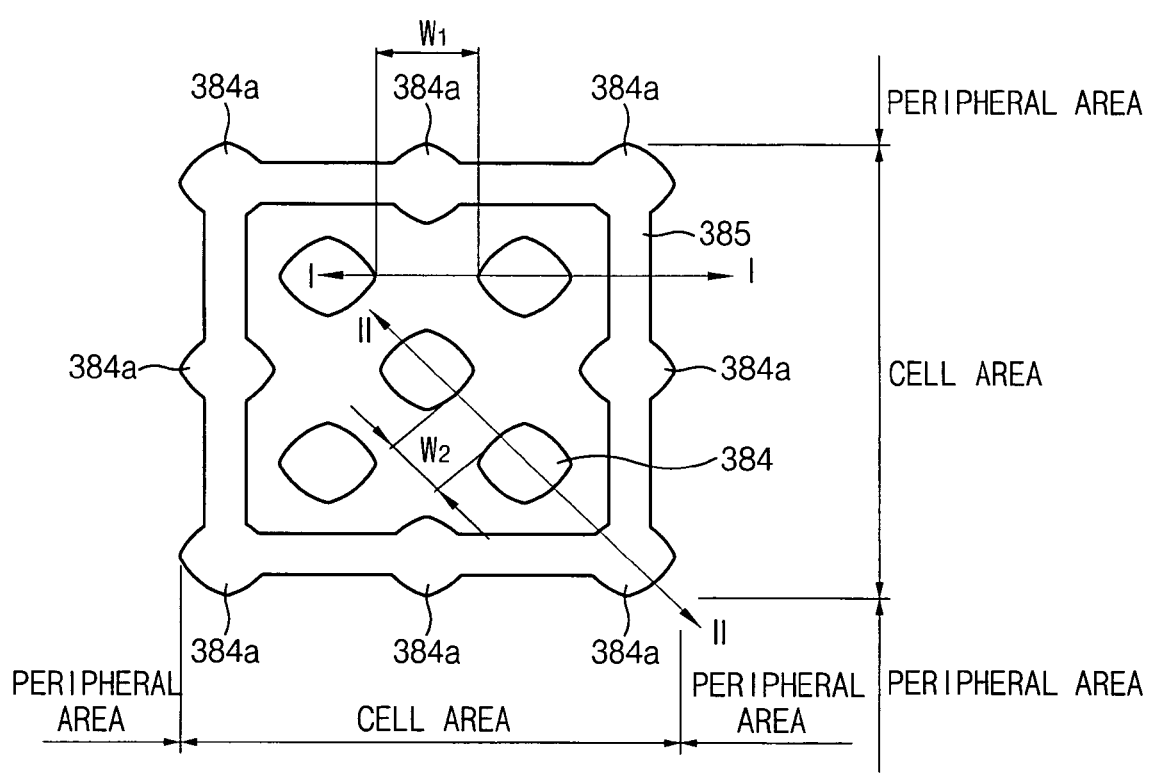
FIGS. 32 and 33 are plan views illustrating processing steps for forming a capacitor according to another exemplary embodiment of the present invention.
Figure 33:
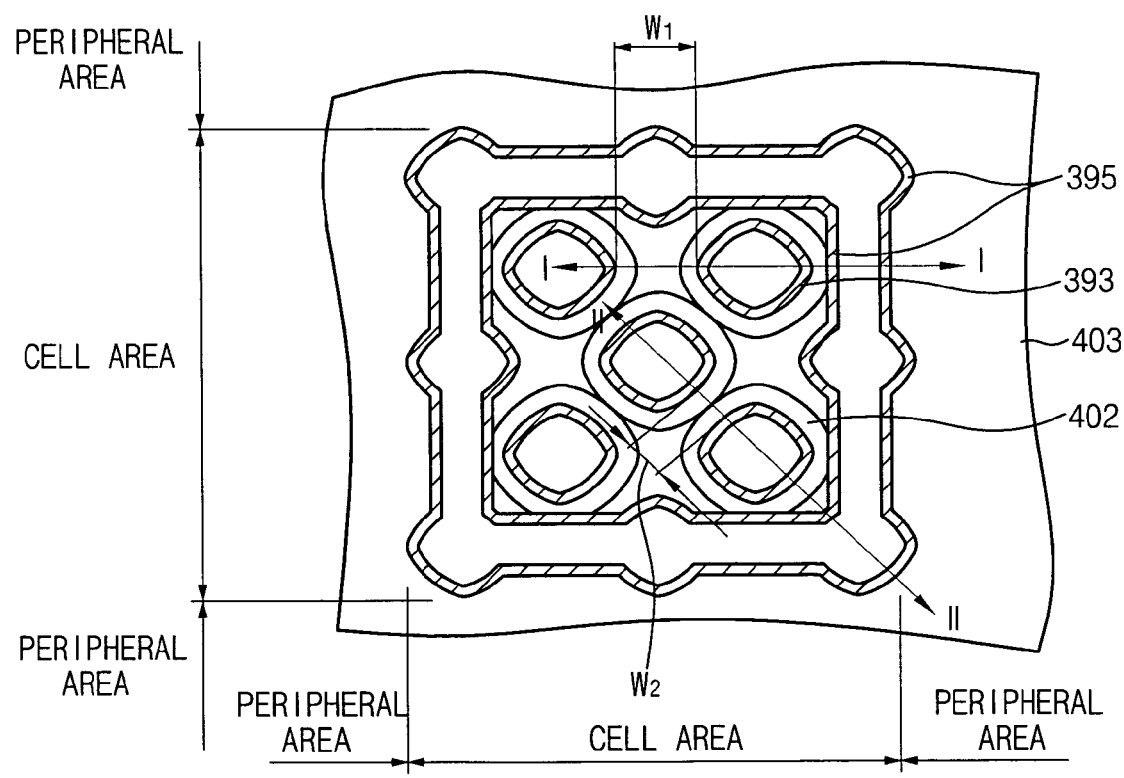

FIGS. 32 and 33 are plan views illustrating processing steps for forming a capacitor according to another exemplary embodiment of the present invention. FIG. 32 is a plan view illustrating a processing step for forming first and second openings through which a surface of the substrate is exposed, and FIG. 33 is a plan view illustrating a processing step for forming a storage electrode and a guide ring.

The capacitor of the present embodiment is the same as the capacitor of the above embodiment described with reference to FIGS. 1 to 28 except for a shape and a position of the second opening 385, a shape and a position of the guide ring 395, and a position of the metal contact plug. The metal contact plug of the present embodiment is formed not around the guide ring 395 but in the peripheral region of the substrate 100. Accordingly, a process for forming the capacitor of the present embodiment is similar to the process in the above embodiment of the present invention, thus detailed descriptions on the identical elements will be omitted.

Referring to FIG. 32, a plurality of first openings 384 and 384a is formed in the cell region of the substrate. The first openings along an outermost edge portion of the cell region are connected with each other through a plurality of second openings 385. As a result, the second openings 385 are formed in the cell region of the substrate, thus the metal contact plug is not formed in the second opening 385, but in the peripheral region of the substrate.

Referring to FIG. 33, the guide ring 395 is formed on sidewalls and bottom surfaces of the first openings positioned along the outermost edge portion of the cell region, and on sidewalls and bottom surfaces of the second openings 385. A width of the second opening 385 may be reduced for facilitating the filling of the guide ring with a conductive material for forming a storage electrode or a plate electrode.

According to the present invention, a support pattern for supporting the storage electrode and for preventing an etching process is formed in the capacitor of the present invention. The support pattern includes a first support pattern for supporting and surrounding a plurality of storage electrodes adjacent to each other in the cell area of the substrate, and a second support pattern for preventing a mold layer from being etched in the peripheral area of the substrate. In addition, a guide ring is formed between the cell area and the peripheral area of the substrate, thus the mold layer is prevented from being etched away. As a result, a step between the cell area and the peripheral area is reduced, thus no additional process is required for reducing the step between the cell area and the peripheral area to thereby simplify the manufacturing process of the semiconductor device. Furthermore, the simplification of the manufacturing process reduces manufacturing costs and time for the semiconductor device to thereby improve productivity of the semiconductor device.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. A method of manufacturing a semiconductor device, comprising:

forming a first opening and a second opening through a plurality of thin layers including a support layer on a substrate, the first opening exposing a top surface of a contact pad formed in a cell area of the substrate, and the second opening being formed in a boundary region of both the cell area and a peripheral area of the substrate;

forming a storage electrode on a sidewall and a bottom of the first opening and forming a guide ring on a sidewall and a bottom of the second opening by removing portions of a conductive layer not formed along the sidewalls and bottoms of the first and second openings, wherein forming the storage electrode and the guide ring includes forming the conductive layer on the sidewalls and bottoms of the first and second openings and on the thin layers, forming a sacrificial layer on the conductive layer to a sufficient thickness to fill the first and second openings, wherein the sacrificial layer comprises an insulation material, and removing the sacrificial layer and the conductive layer until one of the thin layers is exposed, so that the sacrificial layer and the conductive layer remain only in the first and second openings;

forming a mesh-shaped support pattern by etching the thin layers so that the support layer in the cell area is partially etched and the support layer in the peripheral area remains un-etched to thereby be exposed, so that the mesh-shaped support pattern supports and surrounds a plurality of storage electrodes adjacent to each other in the cell area and prevents a layer underlying the support layer from being etched in the peripheral area, wherein forming the mesh-shaped support pattern includes removing a portion of the thin layers on the support layer and an upper portion of the sacrificial layer in the first and second openings until a top surface of the support layer, upper portions of the storage electrode, and the guide ring are exposed, forming a spacer oxide layer on the top surface of the support layer, on a top surface of the sacrificial layer, and on exposed surfaces of the storage electrode and the guide ring, the spacer oxide layer formed to be thicker in the peripheral area than in the cell area, anisotropically etching the spacer oxide layer so that a first portion of the spacer oxide layer in a relatively large interval between the storage electrodes in the cell area is sufficiently removed to expose the support layer and to form a spacer on sidewalls of the exposed storage electrode and guide ring, and a second portion of the spacer oxide layer in a relatively small interval between the storage electrodes in the cell region and a third portion of the spacer oxide layer on the support layer in the peripheral area are not substantially removed, and etching the exposed support layer using the spacer as an etching mask; and sequentially forming a dielectric layer and a plate electrode on the storage electrode and the guide ring.

2. The method of claim 1, further comprising forming a metal contact plug through which a top surface of the plate electrode in the second opening is exposed, the metal contact plug being formed by etching an insulation interlayer on the plate electrode and having a width smaller than a width of the second opening.

3. The method of claim 2, further including forming the second opening with a relatively large width at a portion in which the metal contact plug is formed and a relatively small width at a remaining portion thereof.

4. The method of claim 1, wherein the support layer comprises silicon nitride.

5. The method of claim 1, wherein the plurality of the thin layers except the support layer has an etching selectivity with respect to the support layer.

6. The method of claim 1, further including forming a plurality of protruding portions on the bottom of the second opening for facilitating a filling of the second opening.

7. The method of claim 1, wherein the spacer oxide layer includes a boron phosphorous silicate glass (BPSG) layer or an undoped silicate glass (USG) layer.

* * * * *